(12) United States Patent
Vargo et al.

(10) Patent No.: US 7,223,312 B2
(45) Date of Patent: May 29, 2007

(54) METHODS AND MATERIALS FOR REDUCING DAMAGE FROM ENVIRONMENTAL ELECTROMAGNETIC EFFECTS

(75) Inventors: Terrence G. Vargo, Kenmore, NY (US); Timothy S. Koloski, West Amherst, NY (US)

(73) Assignee: Integument Technologies, Inc., Tonawanda, NY (US)

( * ) Notice: Subject to any disclaimer, the term of this patent is extended or adjusted under 35 U.S.C. 154(b) by 0 days.

(21) Appl. No.: 10/883,481

(22) Filed: Jul. 1, 2004

(65) Prior Publication Data

US 2005/0150596 A1 Jul. 14, 2005

Related U.S. Application Data

(63) Continuation of application No. 09/873,801, filed on Jun. 4, 2001, now abandoned.

(60) Provisional application No. 60/234,424, filed on Sep. 21, 2000.

(51) Int. Cl.
*B32B 31/12* (2006.01)
*B32B 15/08* (2006.01)

(52) U.S. Cl. ..................... 156/71; 156/307.7

(58) Field of Classification Search .................. None
See application file for complete search history.

(56) References Cited

U.S. PATENT DOCUMENTS

| | | | |
|---|---|---|---|
| 3,994,621 A * | 11/1976 | Bogie | 415/186 |
| 4,061,812 A | 12/1977 | Gilwee, Jr. et al. | |
| 4,352,142 A | 9/1982 | Olson | |
| 4,678,699 A | 7/1987 | Kritchevsky et al. | |
| 4,689,098 A | 8/1987 | Gaughan | |
| 4,912,594 A | 3/1990 | Bannink, Jr. et al. | |
| 4,933,060 A | 6/1990 | Prohaska et al. | |
| 4,946,903 A | 8/1990 | Gardella, Jr. et al. | |
| 4,986,496 A | 1/1991 | Marentic et al. | |
| 5,051,312 A | 9/1991 | Allmer | |
| 5,127,601 A | 7/1992 | Schroeder | |
| 5,260,124 A | 11/1993 | Gaier | |

(Continued)

FOREIGN PATENT DOCUMENTS

| | | | |
|---|---|---|---|
| JP | 63162731 A | * | 7/1988 |
| WO | WO 98/37964 | | 9/1998 |
| WO | WO 99/64235 | | 12/1999 |

*Primary Examiner*—Sam Chuan Yao
(74) *Attorney, Agent, or Firm*—Rogalskyj & Weyand, LLP

(57) ABSTRACT

Disclosed is a method of reducing damage resulting from environmental electromagnetic effects on a non-metallic surface. The method includes disposing a polymeric sheet material over the non-metallic surface and disposing a metal layer between the non-metallic surface and the polymeric sheet material. Objects which includes a substrate having a non-metallic surface, a halopolymer sheet material disposed over the substrate's non-metallic surface, and a metal layer disposed between the halopolymer sheet material and the substrate's non-metallic surface are also described. Laminates are also disclosed. One such laminate includes a metal layer having a first surface and a second surface, a halopolymer sheet material bonded or adhered to the first surface of the metal layer, and an adhesive disposed on the second surface of the metal layer. Another such laminate includes a halopolymer fabric having a first surface and a second surface, a metal layer bonded or adhered to the first surface of the halopolymer fabric, and an adhesive disposed on the second surface of the halopolymer fabric.

32 Claims, 5 Drawing Sheets

U.S. PATENT DOCUMENTS

| | | |
|---|---|---|
| 5,266,309 A | 11/1993 | Gardella, Jr. et al. |
| 5,370,921 A | 12/1994 | Cedarleaf |
| 5,627,079 A | 5/1997 | Gardella, Jr. et al. |
| 5,660,667 A | 8/1997 | Davis |
| 5,696,207 A | 12/1997 | Vargo et al. |
| 5,703,173 A | 12/1997 | Koloski et al. |
| 5,806,796 A | 9/1998 | Healey |
| 5,845,872 A | 12/1998 | Pridham et al. |
| 5,865,397 A | 2/1999 | Herrmann |
| 5,866,272 A | 2/1999 | Westre et al. |
| 5,869,412 A | 2/1999 | Yenni, Jr. et al. |
| 5,945,486 A | 8/1999 | Vargo et al. |
| 5,977,241 A | 11/1999 | Koloski et al. |
| 6,013,376 A | 1/2000 | Yenni, Jr. |
| 6,086,975 A | 7/2000 | Brick et al. |
| 6,177,189 B1 | 1/2001 | Rawlings et al. |
| 6,232,386 B1 | 5/2001 | Vargo et al. |
| 6,428,887 B1 | 8/2002 | Vargo et al. |
| 6,790,526 B2 | 9/2004 | Vargo et al. |
| 2003/0152766 A1 | 8/2003 | Vargo et al. |

\* cited by examiner

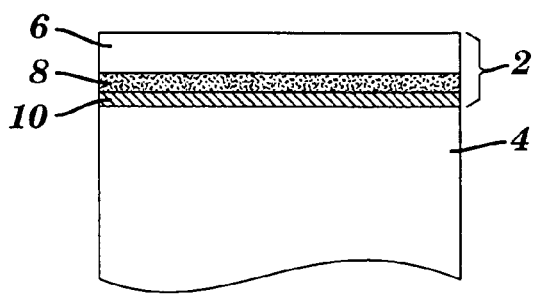 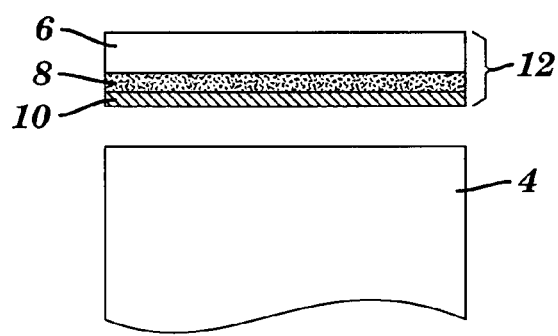
*FIG. 1A*  *FIG. 1B*

METHODS AND MATERIALS FOR REDUCING DAMAGE FROM ENVIRONMENTAL ELECTROMAGNETIC EFFECTS

This application is a continuation of U.S. patent application Ser. No. 09/873,801, filed Jun. 4, 2001 now abandoned, which claims the benefit of U.S. Provisional Patent Application Ser. No. 60/234,424, filed Sep. 21, 2000.

FIELD OF THE INVENTION

The subject invention relates, generally, to methods and materials for reducing damage resulting from environmental electromagnetic effects and, more particularly, to a methods and materials for reducing damage resulting from lightning strikes.

BACKGROUND OF THE INVENTION

A variety of objects, particularly, objects having non-metallic surfaces, can be prone to environmental electro-magnetic effects, such as lightning strikes. For example, MIL-STD-464 describes the importance of considering environmental electromagnetic effects ("$E^3$") when selecting materials for use in military aircraft. More particularly, MIL-STD-464 specifies that all systems, subsystems, and equipment used in constructing an aircraft should be compatible with internal electromagnetic emissions (e.g., electronic noise, RF transmissions, and cross-coupling of electrical currents) and with external electromagnetic emissions (e.g., lightning and electromagnetic pulses).

Typically, metallic aircraft encountering lightning will conduct the electric current of a strike across the skin of the aircraft, in most cases suffering little resultant damage. On the other hand, composite materials like graphite epoxy resins, are resistive conductors that inhibit current conductance. A graphite composite will absorb vastly greater amounts of energy absorbed as compared with by the same mass of aluminum. The intense current density of a lightning strike, can vaporize or "puncture" the thin composite laminates that make up the skin of the aircraft. Once such penetration occurs further damage can be done as the lightning pathway "intrudes" on the avionics, power supply circuitry, or other critical systems, and actual physical damage may result as this current surge travels around and through the inside of the aircraft. Electromagnetic energy may also enter the aircraft through other types of apertures.

Electromagnetic fields that enter the aircraft can wreak havoc with on board avionics. This problem is further aggravated by the increasing use of digital designs in modern avionics to control critical flight functions besides their traditional navigation and communication tasks. It is well known that digital circuits, as compared to analog circuits, have little tolerance for electrical and electromagnetic disturbances. Accordingly, it is important that electromagnetic fields are not permitted to breach the aircraft skin, where they may disrupt avionics, damage structural components, and, perhaps, injure passengers or crew.

Accordingly, a need continues to exist for a method of providing $E^3$ protection for aircraft and other objects. The present invention is directed to meeting this need.

SUMMARY OF THE INVENTION

The present invention relates to a method of reducing damage resulting from environmental electromagnetic effects on a non-metallic surface. The method includes disposing a polymeric sheet material over the non-metallic surface and disposing a metal layer between the non-metallic surface and the polymeric sheet material.

The present invention also relates to an object which includes a substrate having a non-metallic surface, a halopolymer sheet material disposed over the substrate's non-metallic surface, and a metal layer disposed between the halopolymer sheet material and the substrate's non-metallic surface.

The present invention also relates to a laminate. The laminate includes a metal layer having a first surface and a second surface, a halopolymer sheet material bonded or adhered to the first surface of the metal layer, and an adhesive disposed on the second surface of the metal layer.

The present invention also relates to a laminate which includes a halopolymer fabric having a first surface and a second surface. A metal layer is bonded or adhered to the first surface of the halopolymer fabric, and an adhesive is disposed on the second surface of the halopolymer fabric.

BRIEF DESCRIPTION OF THE DRAWINGS

FIGS. 1A and 1B are cross-sectional views of objects produced in accordance with the methods of the present invention.

DETAILED DESCRIPTION OF THE INVENTION

Figure 2A:
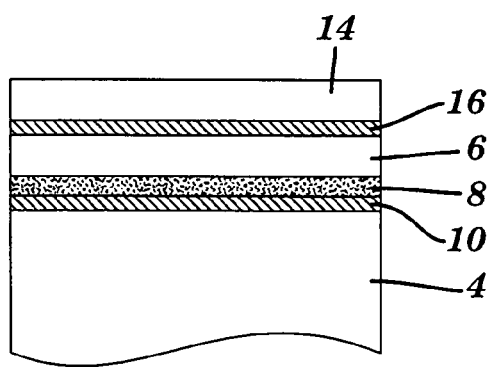
FIGS. 2A, 2B, 2C, and 2D are cross-sectional views of other objects produced in accordance with the present invention.

The present invention relates to a method of reducing damage resulting from environmental electromagnetic effects on a non-metallic surface.

As used herein, "environmental electromagnetic effects" are meant to include one or more of those effects which are described in MIL-STD-464, which is hereby incorporated by reference, such as lightning, High Intensity Radiated Fields ("HIRF"), and other electromagnetic pulses.

"Reducing" and other forms of this term (e.g., "reduction"), as used herein, are meant to include complete prevention (i.e., 100% reduction) as well as reductions less than complete prevention, such as reductions that are less than 100% but that are greater than about 10%, 20%, 30%, 40%, 50%, 60%, 70%, 75%, 80%, 85%, 88%, 90%, 93%, 95%, 97%, 98%, 99%, 99.5%, 99.8%, and/or 99.9%. Reduction can be measured by any convenient method, such as the degree of reduction in repair costs (i.e., costs relating to labor and materials) to repair damage, the degree of reduction in shortened lifespan, the degree of reduction in the number of components that needs to be replaced or repaired, the degree of reduction in the surface area that needs to be replaced or repaired, etc. For example, in the case of damage resulting from a lightning strike on a surface, the degree of reduction can be measured in terms of the repair/replacement costs, in terms of the surface area that needs to be replaced or repaired, or in terms of the surface area that is damaged. Where the degree of reduction can be measured by two or more of these or other suitable methods, the degree of reduction shall be the greater or greatest degree of reduction as measured by these or other suitable methods. Illustratively, in the case where the degree of reduction as measured in terms of the repair/replacement costs is 40%, the degree of reduction as measured in terms of the surface area that needs to be replaced or repaired is 30%, and the degree of reduction as measured in terms of the surface area that needs to be replaced or repaired is 20%, the degree of reduction, for purposes of the present invention, shall be the greatest of 40%, 30%, and 20%, i.e., 40%.

"Damage", as used herein, is meant to include physical damage to the non-metallic surface as well as to the object of which the surface is a part. In the case where the environmental electromagnetic effect is a lightning strike; damage can include holes in the surface caused by the lightning strike, deformations in the surface caused by the lightning strike; as well as undesirable changes in chemical, mechanical, or electrical properties of the surface caused by the lightning strike (particularly those changes which require that the surface be repaired or replaced and/or those changes giving rise to shortened lifespan). "Damage" can also include secondary damage, for example, to components contained by the surface (e.g., damage to the internal components of a airplane's fuselage, such as electronic instrumentation and other electronic components, electrical wiring, pneumatic hoses, motors, generators, turbines, wheels, struts, fuel tanks, and the like) which is caused (in whole or in part) by damage to the non-metallic surface.

"Surface", as used herein, is meant to include any two-dimensional planar or curved surface which is susceptible to damage from one or more environmental electromagnetic effects. Examples of curved surfaces are surfaces that are curved in one dimension, e.g. a cylinder or a cone; surfaces that are curved in two dimensions, e.g. a sphere, an ellipsoid, a paraboloid, a hyperbolic paraboloid, and a hyperbolic ellipsoid; and surfaces that are curved both in one and in two dimensions. Examples of "surfaces" include external surfaces of any object, such as ungrounded objects (e.g., those whose resistance to ground is greater than about 1 ohm, greater than about 10 ohms, greater than about 100 ohms, and/or greater than about 1000 ohms. Objects are meant to include vehicles, such as aircraft vehicles (e.g., airplanes, helicopters, rockets, missiles, reusable space vehicles, etc), water-going vehicles (e.g., boats, ships, hovercraft, and marine vessels), and land vehicles (e.g., cars, trucks, trailers, railroad cars and engines, subway cars and engines, etc.). Airplane fuselages, airplane turbine housings, airplane engine housings, airplane propellers, airplane rudders, airplane wings, airplane wheel mounts and wheels, airplane stabilizers, and the like are all envisioned as having surfaces with which the method of the present invention can be practiced. Objects are also meant to include fixed structures, such as towers, buildings, bridges, fluid-storage tanks (e.g., water tanks, oil tank, etc.), solid storage vessels (e.g., grain silos), windmills, and the like.

Non-metallic surfaces include those surfaces which contain more than an insubstantial amount of a non-metallic element or ion. "Non-metallic element or ion" as used herein, means H, B, C, Si, N, P, As, O, S, Se, Te, halogen, noble gases, ions thereof, and combinations thereof. An "insubstantial amount" of a non-metallic element or ion is an amount which does not substantially increase the surface's susceptibility to damage from environmental electromagnetic effects relative to a surface which does not contain the "insubstantial amount" of a non-metallic element or ion. Examples of non-metallic surfaces include surfaces made of polymers, such as composite materials, such as polymer resins having glass, polymer, or graphite fibers embedded therein. "Non-metallic surface", as used herein, is also meant to include any surface which has conductivity which is substantially less than the conductivity of an aluminum surface, such as a surface which has conductivity which is less than about 95% (e.g., less than about 90%, less than about 80%, less than about 70%, less than about 60%, less than about 50%, less than about 40%, less than about 30%, less than about 20%, less than about 10%, less than about 5%, less than about 2%, and/or less than about 1%) of the conductivity of an aluminum surface.

The method of the present invention includes disposing a polymeric sheet material over the non-metallic surface and disposing a metal layer between the non-metallic surface and the polymeric sheet material. As used herein "sheet material" is meant to include any two-dimensional (planar or curved) material whose two-dimensional form is produced prior to disposing it over the non-metallic surface. Thus, sheet materials are distinguished from paint and other two-dimensional materials which are applied to non-metallic surfaces in the form of a slurry, solution, or colloid. Applicants acknowledge that "sheet", as used by some in the art, is meant to refer to materials that are not delivered in a wound state (e.g., that are not delivered in a rolled-up form) and/or that have thicknesses of 30 mil or greater while those materials that are delivered in a wound state (i.e., that are delivered in a rolled-up form) and/or that have thicknesses of less than 30 mil are referred to as "films". This convention notwithstanding, as used herein, "sheet materials" are meant to include "films".

The polymeric sheet material typically includes a polymer, such as a polyolefin, a polyimide, a polyester, a polyacrylate, a halopolymer, and combinations thereof.

Halopolymers include organic polymers which contain halogenated groups, such as fluoropolymers and fluorochloropolymers. Examples of halopolymers include fluoroalkyl, difluoroalkyl, trifluoroalkyl, fluoroaryl, difluoroaryl, trifluoroaryl, perfluoroalkyl, perfluoroaryl, chloroalkyl, dichloroalkyl, trichloroalkyl, chloroaryl, dichloroaryl, trichloroaryl, perchloroalkyl, perchloroaryl, chlorofluoroalkyl, chlorofluoroaryl, chlorodifluoroalkyl, and dichlorofluoroalkyl groups. Halopolymers also include fluorohydrocarbon polymers, such as polyvinylidine fluoride ("PVDF"), polyvinylflouride ("PVF"), polychlorotetrafluoroethylene ("PCTFE"), polytetrafluoroethylene ("PTFE") (including expanded PTFE ("ePTFE")). Other halopolymers include fluoropolymers perfluorinated resins, such as perfluorinated siloxanes, perfluorinated styrenes, perfluorinated urethanes, and copolymers containing tetrafluoroethylene and other perfluorinated oxygen-containing polymers like perfluoro-2,2-dimethyl-1,3-dioxide (which is sold under the trade name TEFLON-AF). Still other halopolymers which can be used in the practice of the present invention include perfluoroalkoxy-substituted fluoropolymers, such as MFA (available from Ausimont USA (Thoroughfare, N.J.)) or PFA (available from Dupont (Willmington, Del.)), polytetrafluoroethylene-co-hexafluoropropylene ("FEP'"), ethylenechlorotrifluoroethylene copolymer ("ECTFE"), and polyester based polymers, examples of which include polyethyleneterephthalates, polycarbonates, and analogs and copolymers thereof. Organic polymers which contain halogenated groups and which have reactive oxygen functionality incorporated onto their surface, for example as discussed further below, are meant to be included within the meaning of the term "halopolymer".

Polyolefins include polyethylene, polypropylene, polybutylene, and other polyalkylenes.

Polyacrylates are meant to include any polymer containing an acrylic functionality. Examples of such polymers include polyacrylic acid, poly(methyl acrylate), poly(ethyl acrylate), poly(methacrylic acid), poly(methyl methacrylate), poly(ethyl methacrylate), and the like.

Other polymers suitable for use as polymeric sheet materials in accordance with the present invention include homopolymers, copolymers, multicomponent polymers, or combinations thereof. Suitable organic polymers include polyamides, poly(phenylenediamine terephthalamide) filaments, modified cellulose derivatives, starch, polyvinyl alcohols, copolymers of vinyl alcohol with ethylenically unsaturated monomers, polyvinyl acetate, poly(alkylene oxides), vinyl chloride homopolymers and copolymers, terpolymers of ethylene with carbon monoxide and with an acrylic acid ester or vinyl monomer, polysihoxanes, polyfluoroalkylenes, poly(fluoroalkyl vinyl ethers), homopolymers and copolymers of halodioxoles and substituted dioxoles, polyvinylpyrrolidone, or combinations thereof. Other polymers suitable for use as polymeric sheet materials in accordance with the present invention include polytetrafluoroethylene-co-hexafluoropropylene, ethylenechlorotrifluoroethylene copolymer, and polyester based polymers, examples of which include polyethyleneterephthalates, polycarbonates, and analogs and copolymers thereof.

Polyphenylene ethers can also be employed. These include poly (2,6-dimethyl-1,4-phenylene ether), poly(2,6-diethyl-1,4-phenylene ether), poly(2-methyl-6-ethyl-1,4-phenylene ether), poly(2-methyl-6-propyl-1,4-phenylene ether), poly(2,6-dipropyl-1,4-phenylene ether), poly(2-ethyl-6-propyl-1,4-phenylene ether), poly(2,6-dibutyl-1,4-pheneylene ether), and the like.

Examples of suitable polyamides include polyhexamethylene adipamide (nylon 66), polyhexamethylene azelamide (nylon 69), polyhexamethylene sebacamide (nylon 610), polyhexamethylene dodecanoamide (nylon 612), poly-bis-(p-aminocyclohexyl) methane dodecanoamide, polytetramethylene adipamide (nylon 46), and polyamides produced by ring cleavage of a lactam such as polycaprolactam (nylon 6) and polylauryl lactam. Furthermore, there may be used polyamides produced by polymerization of at least two amines or acids used for the production of the above-mentioned polymers, for example, polymers produced from adipic acid, sebacic acid and hexamethylenediamine. The polyamides further include blends of polyamides such as a blend of nylon 66 and nylon 6 including copolymers such as nylon 66/6.

Aromatic polyamides may also be used in the present invention. Preferably they are incorporated in copolyamides which contain an aromatic component, such as melt-polymerizable polyamides containing, as a main component, an aromatic amino acid and/or an aromatic dicarboxylic acid such as para-aminoethylbenzoic acid, terephthalic acid, and isophthalic acid. Typical examples of the thermoplastic aromatic copolyamides include copolymer polyamide of p-aminomethylbenzoic acid and ε-caprolactam (nylon AMBA/6), polyamides mainly composed of 2,2 4-/2,4,4-trimethylhexamethylene-diamine-terephthalamide (nylon TMDT and Nylon TMDT/6I), polyamide mainly composed of hexamethylene diamineisophthalamide, and/or hexamethylenediamineterephthalamide and containing, as another component, bis(p-aminocyclohexyl)methaneisophthalamide and/or bis(p-aminocyclohexyl)methaneterephthalamide, bis(p-aminocyclohexyl)propaneisophthalamide and/or bis(p-aminocyclohexyl)propaneterephthalamide, (nylon 6I/PACM I, nylon 6I/DMPACM I, nylon 6I/PACP I, nylon 6I/6T/PACM I/PACM T, nylon 6I/6T/DMPACM I/DMPACM T, and/or nylon 6I/6T/PACP I/PACP T).

Styrene polymers can also be used. These include polystyrene, rubber modified polystyrene, styrene/acrylonitrile copolymer, styrene/methylmethacrylate copolymer, ABS resin, styrene/alphamethyl styrene copolymer, and the like.

Other suitable representative polymers include, for example, poly(hexamethylene adipamide), poly(ε-caprolactam), poly(hexamethylene phthalamide or isophthalamide), poly(ethylene terephthalate), poly(butylene terephthalate), ethylcellulose and methylcellulose, poly(vinyl alcohol), ethylene/vinyl .alcohol copolymers, tetrafluoroethylene/vinyl alcohol copolymers, poly(vinyl acetate), partially hydrolyzed poly(vinyl acetate), ethylene/carbon monoxide/vinyl acetate terpolymers, ethylene/carbon monoxide/methyl methacrylate terpolymers, ethylene/carbon monoxide/n-butyl acrylate terpolymers, poly(dimethylsiloxane), poly(phenylmethylsiloxane), polyphosphazenes and their analogs, poly(heptafluoropropyl vinyl ether), homopolymers and copolymers of perfluoro(1,3-dioxole) and of perfluoro(2,2-dimethyl-1,3-dioxole), especially with tetrafluoroethylene and optionally with another ethylenically unsaturated comonomer, poly(ethylene oxide), poly(propylene oxide), and poly(tetramethylene oxide).

These and other suitable polymers can be purchased commercially. For example, poly(phenylenediamine terephthalamide) filaments can be purchased from Dupont under the tradename KEVLAR™. Alternatively, polymers suitable for the practice of the present invention can be prepared by well known methods, such as those described in Elias, *Macromolecules—Structure and Properties I and II*, New York: Plenum Press (1977) ("Elias"), which is hereby incorporated by reference.

The polymeric sheet material can be a polymeric fabric. The fabric can be a woven fabric (such as where the fabric is woven from halopolymer (e.g., fluoropolymer) fibers, examples of which include polyvinylidine fluoride fibers, polyethylenetetrafluoroethylene fibers, and HALAR™ and other polyethylenechlorotrifluoro-ethylene fibers). Woven polymeric fabrics can be prepared by any known method, such as the ones described in *Man-made Fiber and Textile Dictionary*, Charlotte, N.C.: Hoechst Celanese Corporation, page 160 (1988), which is hereby incorporated by reference. Alternatively, the fabric can be a non-woven fabric, formed, for example, from a mixture of staple fibers, using conventional methods known in the art for forming a nonwoven web of staple fibers, such as carding, air laying, and garnetting. Nonwoven polymeric can also be formed of mixtures of continuous filaments of different polymer compositions and denier. Continuous filament webs can be formed, for example, by spunbonding processes as known to those skilled in the art, such as are described in U.S. Pat. Nos. 3,338,992; 3,341,394; 3,276,944; 3,502,538; 3,502,763; 3,509,009; 3,542,615; and 3,692,618, which are hereby incorporated by reference. Examples of suitable polymeric fabrics include halopolymer fabrics, such as chlorofluoropolymer fabrics (e.g., ethylene-chloro-trifluoroethylene fabrics) and fluoropolymer fabrics.

The polymeric sheet material can be made of the same materials as is the non-metallic surface, or it can be made of a different material.

As indicated above, the polymeric sheet material is disposed over the non-metallic surface. For purposes of the present invention, a first layer A intended to be deemed as being "over" a second layer B, if (i) the first layer A is disposed directly onto the second layer B, such that first layer A is in direct contact with second layer B or (ii) the first layer A is disposed indirectly onto the second layer B, such that one or more intermediate layer's C are present between first layer A and second layer B.

In addition, as also indicated above, a metal layer is disposed between the polymeric sheet material and the non-metallic surface.

Illustrative metal layers include aluminum, copper, silver, gold, nickel, zinc, and tungsten. The metal layer can be of substantially uniform thickness, or, alternatively, as in the case where the metal layer has a pattern of varying thickness. Such "patterned metal layers" include those metal layers which contain holes therethrough, for example, where the metal layer is in the form of a mesh or a screen, such as a wire screen. As used herein, "screen" is also meant to include expanded metal foils, such as copper expanded metal foils and aluminum expanded metal foils, examples of which include those expanded metal foils commercially available from AstroSeal Products Mfg., Old Saybrook, Conn.; Delker Corporation, Branford Conn.; and EXMET Corporation, Naugatuck, Conn.

Optionally, there can be one or more other intermediate layers (i.e., other than the metal layer) disposed between the polymeric sheet material and the non-metallic surface.

For purposes of the present invention, a second layer B is intended to be deemed as being "between" a first layer A and a third layer C, if (i) second layer B is disposed directly onto first layer A and third layer C is disposed directly onto second layer B, such that second layer B is in direct contact with first layer A and with third layer C; or (ii) second layer B is disposed directly onto first layer A, such that second layer B is in direct contact with first layer A, and third layer C is disposed indirectly onto second layer B, such that one or more intermediate layer's D are present between second layer B and third layer C; or (iii) second layer B is disposed indirectly onto first layer A, such that one or more intermediate layer's E are present between second layer B and first layer A, and third layer C is disposed directly onto second layer B, such that second layer B is in direct contact with third layer C; or (iv) second layer B is disposed indirectly onto first layer A, such that one or more intermediate layer's E are present between second layer B and first layer A, and third layer C is disposed indirectly onto second layer B, such that one or more intermediate layer's D are present between second layer B and third layer C.

For example, the polymeric sheet material can be disposed directly onto the metal layer, such that the polymeric sheet material is in direct contact with metal layer. This can be done, for example, by adhering the polymeric sheet material directly to the metal layer using, for example, an adhesive. The adhesive can be spread (for example, by brushing, rolling, and/or spraying) on the polymeric sheet material or on the metal layer or both prior to bringing the polymeric sheet material into contact with the metal layer. Alternatively, the adhesive can be a pressure-sensitive adhesive layer disposed on the polymeric sheet material so that when the adhesive formed on the polymeric sheet material is brought into contact with the metal layer surface, the polymeric sheet material becomes adhered to the metal layer. One way of doing this is to first apply a pressure-sensitive adhesive transfer tape, such as an acrylic pressure-sensitive adhesive transfer tape, to one side of the polymeric sheet material.

In some cases and, particularly, in cases where the polymeric sheet material includes a halopolymer, it can be desirable to treat the surface of the halopolymer sheet material so as to improve adhesion of the adhesive layer (e.g., the pressure-sensitive adhesive transfer tape described above) to the halopolymer sheet material.

One way of treating the surface of the halopolymer sheet material so as to improve adhesion of the adhesive layer involves incorporating reactive oxygen functionality onto the halopolymer sheet material's surface. A variety of methods for incorporating reactive oxygen functionality onto halopolymers are available and useful for this aspect of the present invention. These methods include plasma and corona discharge treatments, ion beam and electron beam bombardment, x-ray and gamma ray treatments, as well as a variety of wet chemical processes including treatments with sodium in liquid ammonia or sodium naphthalene in glycol ether or surface reduction with benzoin dianion. All of the above methods are described in detail in Lee et al., "Wet-process Surface Modification of Dielectric Polymers: Adhesion Enhancement and Metallization," *IBM J. Res. Develop.*, 38(4) (July 1994); Vargo et al., "Adhesive Electroless Metallization of Fluoropolymeric Substrates," *Science*, 262:1711–1712 (1993); Rye et al., "Synchrotron Radiation Studies of Poly(tetrafluoroethylene) Photochemistry," *Langmuir*, 6:142–146 (1990); and Tan et al., "Investigation of Surface Chemistry of Teflon. 1. Effect of Low Energy Argon Ion Irradiation on Surface Structure," *Langmuir*, 9:740–748 (1993), which are hereby incorporated by reference.

For example, one suitable method for introducing oxygen functionality involves exposing the surface halogen atoms of the halopolymer sheet material to actinic radiation, e.g., ultraviolet, X-ray, or electron beam radiation, in the presence of oxygen-containing organic compounds commonly referred to as "organic modifiers". Examples of suitable organic modifiers include sodium 4-aminothiophenoxide ("SATP"), sodium benzhydroxide ("SBH"), disodium 2-mercapto-3-butoxide ("DDSMB"), and other strong reducing agents which facilitate hydrogen or halogen abstraction in the presence of actinic radiation. In practice, halopolymer sheet material is immersed into one or more of the organic modifiers and simultaneously exposed to actinic radiation, such as UV radiation, for a prescribed length of time. Further details with regard to this method of introducing oxygen functionality is described in, for example, U.S. Pat. No. 5,051,312 to Allmer, which is hereby incorporated by reference.

Another method for introducing oxygen functionality onto the surface of halopolymer sheet materials involves exposing the halopolymer sheet materials to radio frequency glow discharges ("RFGD") under vacuum in the presence of a gas-vapor.

Briefly, the halopolymer sheet material, in an atmosphere of a gas/vapor mixture, is exposed to a single or series of radio frequency glow discharges at power loadings of less than or equal to 100 watts and pressures of under 1 Torr, such as from about 50 to 200 mTorr.

Although not wishing to be held to any precise mode of action, the primary mechanism of this plasma treating process is believed to involve the transfer of energy to the gaseous ions directly to form charged ionized gas species, i.e., ion sputtering of the polymer at the gas-solid interface. The radio frequency glow discharge plasma gas ions become excited through direct energy transfer by bombarding the gas ions with electrons. Thus, by exposing the halopolymer sheet material to either a single or a series of radio frequency glow discharge gas/vapor plasmas, from about 1% to about 98% of the surface halogen atoms are permanently removed in a controlled and/or regulated manner and replaced with hydrogen atoms along with oxygen atoms or low molecular weight oxygen-containing radicals. Suitable gas vapor plasmas include those containing admixtures of hydrogen gas, preferably ranging from about 20% to about 99%, by volume, and about 1% to about 80%, by volume, of a liquid vapor, such as liquid vapor of water, methanol, formaldehyde, or mixtures thereof. Although hydrogen is required in all instances, hydrogen, by itself, is generally insufficient to introduce both hydrogen and oxygen moieties into the carbon polymer backbone. A nonpolymerizable vapor/$H_2$ mixture is believed to be necessary to permanently introduce the required hydrogen and oxygen or functionalized moieties into the halopolymer without disrupting surface morphology. Use of pure gas mixtures, specifically $H_2/O_2$, generally gives inferior results. Representative radio frequency glow discharge plasmas and operating conditions are provided in Table 1 below.

this and other methods for applying a metal layer to a polymeric sheet material, especially to a halopolymer sheet material, are described, for example, in U.S. Pat. No. 5,696,207 to Vargo et al. ("Vargo I"), U.S. Pat. No. 5,703,173 to Koloski et al. ("Koloski"), and U.S. Pat. No. 5,945,486 to Vargo et al. ("Vargo II"), each of which is hereby incorporated by reference.

Other methods for treating the surface of the halopolymer sheet material so as to improve adhesion of the adhesives thereto are described in U.S. Pat. No. 4,933,060 to Prohaska et al., which is hereby incorporated by reference.

The metal layer and polymeric sheet material can be disposed on the non-metallic surface sequentially for example, by first disposing the metal layer (e.g., a copper mesh, a copper screen (such as an expanded copper foil), or a metal film) onto the non-metallic surface and then disposing polymeric sheet material over the metal layer.

Alternatively, the metal layer and polymeric sheet material can be disposed on the non-metallic surface simultaneously in a single step. This is done, for example, by first

TABLE 1

| Starting Material | RFGD Mix Composition | Pressure (mTorr) | Time (Min.) | Depth (A) | CALCULATED ATOMIC RATIOS (ESCA) | | | |
|---|---|---|---|---|---|---|---|---|
| | | | | | C/O | C/F | F/O | Stoichiometry |
| Unmodified PTFE | — | — | — | — | ∞ | 0.45 | ∞ | $C_2F_{23}$ |
| Unmodified PVDF | — | — | — | — | ∞ | 1.0 | ∞ | $C_1F_1$ |
| Modified PTFE | 2% $H_2O$ 98% $H_2$ | 150 | 20 | 100 | 7.5 | 1.5 | 5.0 | $C_{13}F_{10}H_{13}O_2$ |
| Modified PTFE | 2% $H_2O$ 98% $H_2$ | 200 | 10 | 100 | 8.6 | 0.91 | 9.7 | $C_{17}F_{19}H_{13}O_2$ |
| Modified PTFE | 20% MeOH(g) 80% $H_2$ | 150 | 30 | 100 | 3.0 | 1.5 | 2.0 | $C_6F_4H_6O_2$ |
| Modified PTFE | 20% MeOH(g) 80% $H_2$ | 200 | 5 | 100 | 9.3 | 2.0 | 4.7 | $C_{17}F_{14}H_{39}O_3$ |
| Modified PVDF | 2% $H_2O$ 98% $H_2$ | 200 | 10 | 100 | 8.0 | 16.0 | 0.48 | $C_{16}F_1H_{13}O_2$ |

Through specific and controlled addition of oxygen functionality via radio frequency glow discharge, the surface-modified halopolymer sheet materials disclosed herein may remain resistant to fouling and adsorption of substances, a property which is consistent with the unmodified halopolymer sheet materials. However, unlike unmodified halopolymer sheet materials, such as PTFE sheet materials, it has been found that the surface-modified halopolymer sheet materials have the unique ability to react cleanly and rapidly with various atoms, molecules, or macromolecules through the oxygen containing groups (e.g., hydroxyl, carboxylic acid, ester, aldehyde, and the like) on the surface-modified halopolymer sheet material's surface to form refunctionalized surface-modified halopolymer sheet materials. In addition, due to the relative inertness of the surface-modified halopolymer sheet materials's surface, the ability to incorporate permanent reactive functionality onto the surfaces of these sheet materials creates a material which is specifically and controllably reactive while also being inert to other chemical and environmental concerns, e.g., adsorption of surface contaminants.

Further details with regard to this method are described in, for example, U.S. Pat. Nos. 4,946,903, 5,266,309, and 5,627,079, all to Gardella, Jr. et al. (collectively, "Gardella"), which are hereby incorporated by reference, and in applicants' U.S. patent application Ser. No. 09/239,108, which is hereby incorporated by reference. In addition, applying the metal layer to the polymeric sheet material and then disposing the resulting layered composite over the non-metallic surface.

As indicated above, the metal layer can be applied to the halopolymer sheet material by adhering it thereto, for example, by using an adhesive, or, alternatively, the metal layer can be applied to the halopolymer sheet material by bonding it thereto, for example, using the methods described below.

One such procedure for bonding a metal layer to a halopolymer sheet material involves modifying the halopolymer by substituting at least a portion of the halogen atoms with hydrogen and oxygen or oxygen-containing groups on the outermost surface of the halopolymer. As used in this context, "outermost surface of the halopolymer" is meant to include depths of up to about 200 Å. The resulting oxyhalopolymer is then contacted with a solution of gas which includes a metal (e.g., in the form of a metal complex) for a time sufficient to facilitate bonding (e.g., covalent bonding) of the metal to the oxyhalopolymer to form a bonded (e.g., a covalently bonded) conductive metal layer. As one skilled in the art will appreciate, not all of the metal atoms in the metal layer need be bonded to the oxyhalopolymer. Rather, it is expected that the layer is a multimolecular layer of metal atoms (e.g., from 10 Å to more than a micron thick) which is stabilized by an initial molecular layer of metal atoms that are bonded to the oxyhalopolymer.

The degree to which the halopolymer's surface halogen atoms are substituted with hydrogen and oxygen or oxygen-containing groups is not particularly critical to the practice of the present invention. For example, from about 1 to about 90 percent of the surface halogen atoms of the halopolymer can be permanently substituted with hydrogen and oxygen or oxygen-containing groups. Of these, from about 30 to about 100 percent can be replaced with oxygen or oxygen-containing groups and from about 0 to about 70 percent can be replaced with hydrogen atoms. Furthermore and, again, illustratively, from about 1 to about 100 percent of the oxygen or oxygen-containing groups of the oxyhalopolymer can have metal bonded thereto.

As indicated above, this procedure involves modifying the halopolymer to substitute at least a portion of the halogen atoms with hydrogen and oxygen or oxygen-containing groups on the outermost surface of the halopolymer. The halopolymer can be modified by a variety of methods, such as by radio-frequency glow discharge of a hydrogen/methanol gas-vapor under vacuum, by wet chemical reduction, by exposing the halopolymer to actinic radiation in the presence of oxygen-containing organic modifiers, and by combinations of these methods.

Further details with regard to modifying halopolymers so as to facilitate applying metal layers to their surfaces and with regard to halopolymers having metal layers covalently bonded to the surfaces thereof are described in Koloski, which is hereby incorporated by reference.

Another procedure for bonding a metal layer to a halopolymer sheet material involves contacting the surface of the halopolymer sheet material substrate, which surface has ligands thereon which will bind an electroless metallization catalyst, with an electroless metallization catalyst to obtain a catalytic surface. The resulting catalytic surface is then contacted with an electroless metallization solution under conditions effective to metallize the surface. Examples of electroless metallization catalysts include palladium, platinum, rhodium, iridium, nickel, copper, silver, and gold. Ligands which will bind an electroless metallization catalyst and which can be used in the practice of this embodiment of the present invention include (C1–C4)-alkylamino, di-(C1–C4)-alkylamino, 2-aminoethylamino, diethylenetriamino, pyridyl, bipyridyl, diphenylphosphino, mercapto, isonitrilo, nitrilo, imidazoyl, pyrrolyl, cyclopentadienyl, glycidoxy, and vinyl. Any suitable method can be used to prepare the surface of the halopolymer sheet material so that it has ligands thereon which will bind an electroless metallization catalyst. Illustratively, a halopolymer sheet material having a surface containing hydroxyl groups can be contacted with a silane coupling agent which includes a functionality that can bind an electroless metallization catalyst, for example, silane coupling agents having the formula $Y—(CH_2)_nSi(X)_3$, where Y represents a group which contains a ligand which can bind an electroless metallization catalyst; each X, independently, represents chlorine, bromine, fluorine, alkyl (e.g., having 1 to 4 carbon atoms), chloroalkyl (e.g., chloromethyl), monoalkylamino (e.g., monoethylamino), dialkylamino (e.g., dimethylamino), alkoxy (e.g., methoxy, ethoxy, propoxy, isopropoxy, butoxy, and phenoxy), trimethylsilyl, or trimethylsilylamino; and n is an integer of, for example, from 1 to 17.

Halopolymer sheet materials having a surface containing hydroxyl groups can be prepared from their corresponding halopolymer sheet materials by incorporating reactive oxygen functionality onto the halopolymer sheet material's surface. This can be achieved, for example, by contacting the halopolymer sheet material with a gas/vapor plasma mixture which includes hydrogen and at least one member selected from the group consisting of water, methanol, and formaldehyde, while exposing the halopolymer to at least one radio frequency glow discharge under vacuum.

Further details with respect to this method can be found, for example, in Vargo I and Vargo II, which are hereby incorporated by reference.

The metallized surface bonded to the halopolymer sheet material can be uniformly thick or, alternatively, it can be patterned, having, for example, regions of metallization and regions of no metallization, for example, in the form of a Cartesian grid. Such patterns can be formed, for example, by contacting the halopolymer sheet material with the gas/vapor mixture while the radio frequency glow discharge exposure is carried out through a mask to obtain a surface which has hydroxyl groups arranged in a pattern. Alternatively or additionally, the pattern can be introduced later in the process, for example, after preparation of the halopolymer sheet material having ligands thereon which will bind an electroless metallization catalyst. This can be achieved, for example, by irradiating the surface having ligands which will bind an electroless metallization catalyst through a mask to remove a portion of said ligands from said surface. Further details regarding methods for producing halopolymer sheet material having patterned metal layers bonded thereto are described, illustratively, in Vargo I and Vargo II, which are hereby incorporated by reference.

Once the metal layer is bonded or adhered to the polymeric sheet material, the resulting composite laminate can be adhered directly to the non-metallic surface, for example, using any of the methods disclosed above for adhering polymeric sheet materials directly to metal layers. As used herein, "laminate" is meant to include any layered structure and is meant to include appliques.

For example, referring to FIG. 1A, there is shown a cross-sectional view of laminate structure 2 disposed over non-metallic surface 4. Laminate structure 2 includes polymeric sheet material 6 and metal layer 8 disposed between polymeric sheet material 6 and non-metallic surface 4. The illustrative embodiment of FIG. 1A shows, more particularly, metal layer 8 disposed directly on polymeric sheet material 6, for example, bonded using the bonding methods described above (e.g., those described in Vargo I, Koloski, and/or Vargo II, which are hereby incorporated by reference) or adhered using, for example, an adhesive (not shown). Metal layer 8 is also shown to be adhered to non-metallic surface 4 using adhesive 10. Suitable adhesives that can be used to adhere metal layer 8 directly to non-metallic surface 4 include, for example, acrylic adhesives (which are meant to include those based on acrylic as well as methacrylic functionality), urethane based adhesives, epoxy based adhesives, aqueous based adhesives, solvent based adhesives, fluorine based adhesives, polyester based adhesives, heat sealable adhesives, pressure sensitive rubber adhesives, pressure sensitive acrylic adhesives, pressure sensitive silicone adhesives, release coating adhesives, and the like. Adhesive 10 can be disposed on metal layer 8, on non-metallic surface 4, or on both metal layer 8 and on non-metallic surface 4 prior to bringing metal layer 8 into contact with non-metallic surface 4. In one embodiment, adhesive 10 is applied as a pressure-sensitive adhesive transfer tape, such as an acrylic pressure-sensitive adhesive transfer tape, to metal layer 8, thus forming laminate structure 12, as shown in FIG. 1B, which can be positioned over, brought into contact with, and, thus, adhered to non-metallic surface 4.

As indicated above, polymeric sheet material 6 can be a fabric, such as a halopolymer fabric (e.g., a fluoropolymer fabric or a chlorofluoropolymer fabric), and it can be woven or non-woven, such as described in greater detail above.

The method of the present invention can optionally include disposing a second polymeric sheet material over the polymeric sheet material described above. This embodiment of the present invention is illustrated in FIG. 2A, where there is shown first polymeric sheet material 6 disposed over non-metallic surface 4; metal layer 8 disposed between first polymeric sheet material 6 and non-metallic surface 4; and second polymeric sheet material 14 disposed over first polymeric sheet material 6. Second polymeric sheet material 14 can be a uniformly thick or, alternatively, it can be a woven or non-woven fabric (e.g., a woven or non-woven fluoropolymer fabric). Further, as discussed above, first polymeric sheet material 6 can be a woven or non-woven fabric (e.g., a woven or non-woven fluoropolymer fabric); metal layer 8 can be bonded to first polymeric sheet material 6 using, for example, the methods described above (e.g., those described in Vargo I, Koloski, and/or Vargo II, which are hereby incorporated by reference), or metal layer 8 can be adhered to first polymeric sheet material 6 using, for example, an adhesive (not shown); and/or metal layer 8 can be adhered directly to non-metallic surface 4, such as with adhesive 10, for example, an acrylic pressure-sensitive adhesive transfer tape.

Disposing second polymeric sheet material 14 over first polymeric sheet material 6 is meant to include those cases where second polymeric sheet material 14 is disposed directly on first polymeric sheet material 6 and, optionally, adhered thereto, for example, using an appropriate adhesive (illustrated in FIG. 2A as adhesive 16), such as an acrylic pressure-sensitive adhesive transfer tape. In the case where an adhesive (e.g., adhesive 16) is employed and where one or both of first polymeric sheet material 6 and second polymeric sheet material 14 are halopolymers (e.g., fluoropolymers), it can be desirable to treat the surface of the first and/or second halopolymer sheet material so as to improve adhesion of adhesive 16 (e.g., the pressure-sensitive adhesive transfer tape described above) to one or both of the halopolymer sheet materials.

Figure 2B:
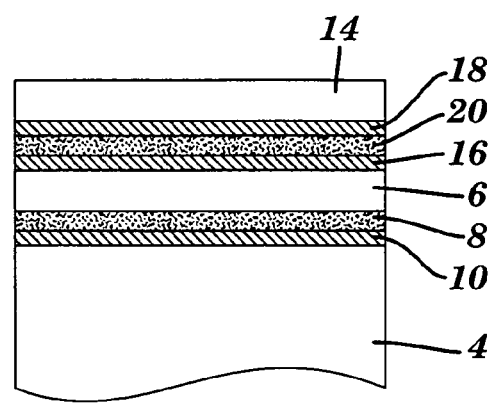

Disposing a second polymeric sheet material over the first polymeric sheet material is also meant to include those cases where a second polymeric sheet material is not disposed directly on the first polymeric sheet material, such as where one or more polymeric or metal layers (other than adhesive transfer tape layers) are disposed between the second polymeric sheet material and the first polymeric sheet material. One such embodiment of the present invention is illustrated in FIG. 2B. Here, first polymeric sheet material 6 is disposed over non-metallic surface 4; first metal layer 8 is disposed between first polymeric sheet material 6 and non-metallic surface 4 and metal layer 8 is optionally adhered to non-metallic surface 4 with optional adhesive 10; second polymeric sheet material 14 is disposed over first polymeric sheet material 6 and; and second metal layer 20 is disposed between first polymeric sheet material 6 and second polymeric sheet material 14. As with the other layers of this laminate structure, second metal layer 20 can be optionally adhered to one or both of first polymeric sheet material 6 and second polymeric sheet material 14 using one or both of optional adhesive 16 and optional adhesive 18. Suitable adhesives for use here are the same as those described above and include, for example, acrylic pressure-sensitive adhesive transfer tapes. Again, in the case where one or both of optional adhesive 16 and optional adhesive 18 are employed and in the case where one or both of first polymeric sheet material 6 and second polymeric sheet material 14 are halopolymers (e.g., fluoropolymers), it can be desirable to treat the surface of the first and/or second halopolymer sheet material so as to improve adhesion of one or both of optional adhesive 16 and optional adhesive 18 (e.g., the pressure-sensitive adhesive transfer tape described above) to one or both of first polymeric sheet material 6 and second polymeric sheet material 14.

Figure 2C:
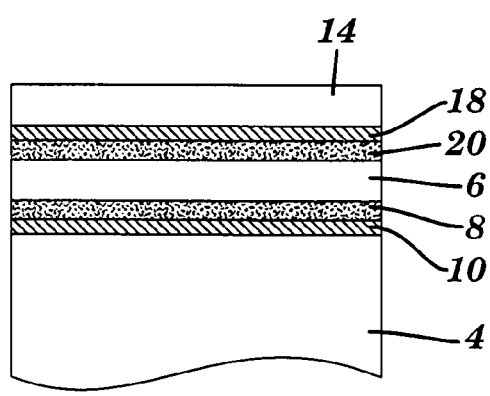

Rather than using optional adhesive 16 to adhere second metal layer 20 to first polymeric sheet material 6, second metal layer 20 can be bonded directly to first polymeric sheet material 6, for example, particularly in the case where first polymeric sheet material 6 is a halopolymer, by using the metallization procedures described above and, for example, Vargo I, Koloski, and/or Vargo II, which are hereby incorporated by reference. This embodiment of the present invention is illustrated in FIG. 2C.

Figure 2D:
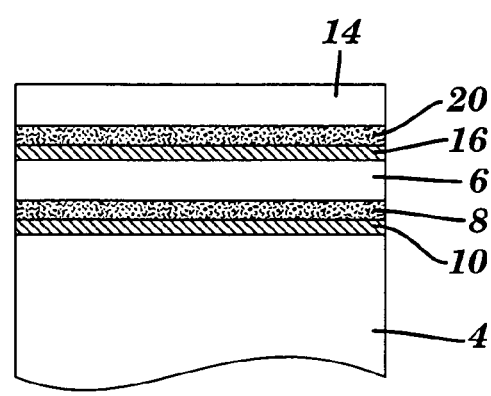

Alternatively, rather than using optional adhesive 18 to adhere second metal layer 20 to second polymeric sheet material 14, second metal layer 20 can be bonded directly to second polymeric sheet material 14, as illustrated in FIG. 2D. For example and particularly in cases where second polymeric sheet material 14 is a halopolymer, this direct bonding between second metal layer 20 and second polymeric sheet material 14 can be effected by the metallization procedures described above and in Vargo I, Koloski, and/or Vargo II, which are hereby incorporated by reference. Once second metal layer 20 and second polymeric sheet material 14 have been thus bonded, the resulting layered composite can be adhered to first polymeric sheet material 6 using optional adhesive 16, as illustrated in FIG. 2D.

Figure 3A:
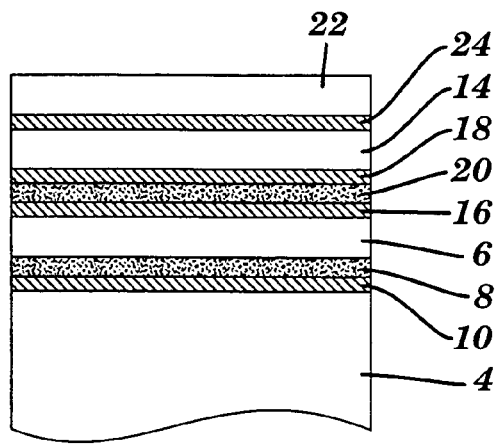
FIGS. 3A, 3B, 3C, and 3D are cross-sectional views of other objects produced in accordance with the methods of the present invention.

The method of the present invention can optionally further include disposing a third polymeric sheet material over the second polymeric sheet material described above. This embodiment of the present invention is illustrated in FIG. 3A, where there is shown first polymeric sheet material 6 disposed over non-metallic surface 4; first metal layer 8 disposed between first polymeric sheet material 6 and non-metallic surface 4; second polymeric sheet material 14 disposed over first polymeric sheet material 6; second metal layer 20 disposed between second polymeric sheet material 14 and first polymeric sheet material 6; and third polymeric sheet material 22 disposed over second polymeric sheet material 14. Third polymeric sheet material 22 can be a uniformly thick or, alternatively, it can be a woven or non-woven fabric (e.g., a woven or non-woven fluoropolymer fabric). Further, as discussed above, first polymeric sheet material 6 and/or second polymeric sheet material 14 can be a woven or non-woven fabric (e.g., a woven or non-woven fluoropolymer fabric); metal layer 8 can be bonded to first polymeric sheet material 6 using, for example, the methods described above (e.g., those described in Vargo I, Koloski, and/or Vargo II, which are hereby incorporated by reference), or metal layer 8 can be adhered to first polymeric sheet material 6 using, for example, an adhesive (not shown); first metal layer 8 can be adhered directly to non-metallic surface 4, such as with adhesive 10, for example, an acrylic pressure-sensitive adhesive transfer tape; second metal layer 20 can be adhered directly to both first polymeric sheet material 6 and/or second polymeric sheet material 14, such as with adhesive 16 and adhesive 18, for example, an acrylic pressure-sensitive adhesive transfer tape; and/or second metal layer 20 can be bonded directly to either first polymeric sheet material 6 or second polymeric sheet material 14 using, for example, the methods described above (e.g., those described in Vargo I, Koloski, and/or Vargo II, which are hereby incorporated by reference).

Disposing third polymeric sheet material 22 over second polymeric sheet material 14 is meant to include those cases where third polymeric sheet material 22 is disposed directly on second polymeric sheet material 14 and, optionally, adhered thereto, for example, using an appropriate adhesive (illustrated in FIG. 3A as adhesive 24), such as acrylic pressure-sensitive adhesive transfer tape. In the case where an adhesive (e.g., adhesive 24) is employed and where one or both of second polymeric sheet material 14 and third polymeric sheet material 22 are halopolymers (e.g., fluoropolymers), it can be desirable to treat the surface of the second and/or third halopolymer sheet material so as to improve adhesion of adhesive 24 (e.g., the pressure-sensitive adhesive transfer tape described above) to one or both of the halopolymer sheet materials.

Figure 3B:
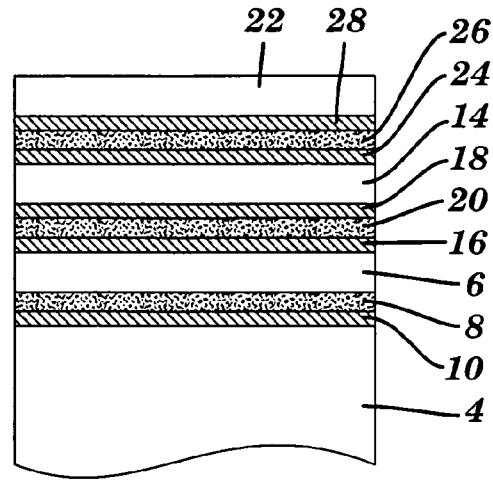

Disposing a third polymeric sheet material over the second polymeric sheet material is also meant to include those cases where a third polymeric sheet material is not disposed directly on the second polymeric sheet material, such as where one or more polymeric or metal layers (other than adhesive transfer tape layers) are disposed between the third polymeric sheet material and the second polymeric sheet material. One such embodiment of the present invention is illustrated in FIG. 3B. Here, first polymeric sheet material 6 is disposed over non-metallic surface 4; first metal layer 8 is disposed between first polymeric sheet material 6 and non-metallic surface 4 and metal layer 8 is optionally adhered to non-metallic surface 4 with optional adhesive 10; second polymeric sheet material 14 is disposed over first polymeric sheet material 6 and; and second metal layer 20 is disposed between first polymeric sheet material 6 and second polymeric sheet material 14. In the embodiment illustrated, second metal layer 20 is adhered to first polymeric sheet material 6 and to second polymeric sheet material 14 with optional adhesive 16 and optional adhesive 18, respectively. Third polymeric sheet material 22 is disposed over second polymeric sheet material 14, and third metal layer 26 is disposed between third polymeric sheet material 22 and second polymeric sheet material 14. Third metal layer 26 can be optionally adhered to one or both of second polymeric sheet material 14 and third polymeric sheet material 22 using one or both of optional adhesive 24 and optional adhesive 28. Suitable adhesives for use here are the same as those described above and include, for example, acrylic pressure-sensitive adhesive transfer tapes. Again, in the case where one or both of optional adhesive 24 and optional adhesive 28 are employed and in the case where one or both of second polymeric sheet material 14 and third polymeric sheet material 22 are halopolymers (e.g., fluoropolymers), it can be desirable to treat the surface of the second and/or third halopolymer sheet material so as to improve adhesion of one or both of optional adhesive 24 and optional adhesive 28 (e.g., the pressure-sensitive adhesive transfer tape described above) to one or both of second polymeric sheet material 14 and third polymeric sheet material 22.

Figure 3C:
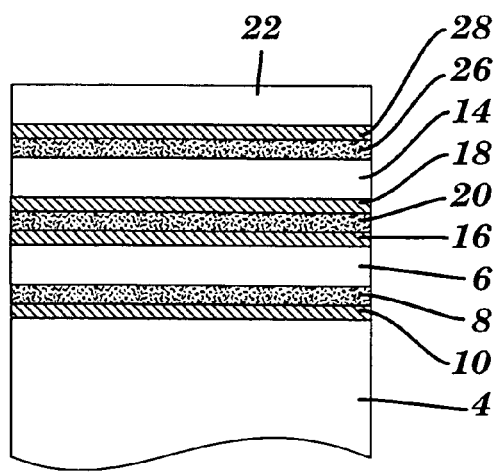

Rather than using optional adhesive 24 to adhere third metal layer 26 to second polymeric sheet material 14, third metal layer 26 can be bonded directly to second polymeric sheet material 14, for example, particularly in the case where second polymeric sheet material 14 is a halopolymer, by using the metallization procedures described above and, for example, in Vargo I, Koloski, and/or Vargo II, which are hereby incorporated by reference. This embodiment of the present invention is illustrated in FIG. 3C.

Figure 3D:
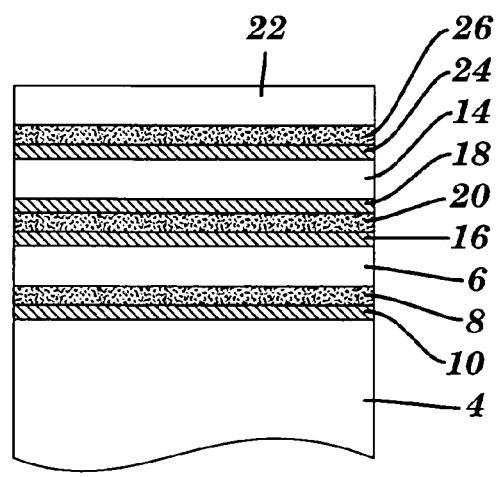

Alternatively, rather than using optional adhesive 28 to adhere third metal layer 26 to third polymeric sheet material 22, third metal layer 26 can be bonded directly to third polymeric sheet material 22, as illustrated in FIG. 3D. For example and particularly in cases where third polymeric sheet material 22 is a halopolymer, this direct bonding between third metal layer 26 and third polymeric sheet material 22 can be effected by the metallization procedures described above and in Vargo I, Koloski, and/or Vargo II, which are hereby incorporated by reference. Once third metal layer 26 and third polymeric sheet material 22 have been thus been bonded, the resulting layered composite can be adhered to second polymeric sheet material 14 using optional adhesive 24, as illustrated in FIG. 2D.

One illustrative embodiment of the present invention utilizes laminate structures, to which the present invention is also directed. More particularly, these laminate structures include a halopolymer polymeric sheet material; a metal layer bonded thereto (such as by using the metallization procedures described above and in Vargo I, Koloski, and/or Vargo II, which are hereby incorporated by reference) or a metal layer adhered thereto (such as by using an adhesive); and an adhesive layer disposed and adhered to the metal layer. The laminate structure is then disposed onto a non-metallic surface such that the adhesive layer of the laminate structure contacts and adheres to the non-metallic surface. A second laminate structure can then be disposed onto the first laminate structure, such that the adhesive of the second laminate structure contacts and adheres to the halopolymer polymeric sheet material of the first layer. The process can be repeated multiple times (e.g., once more, twice more, thrice more, etc.).

Figure 4A:
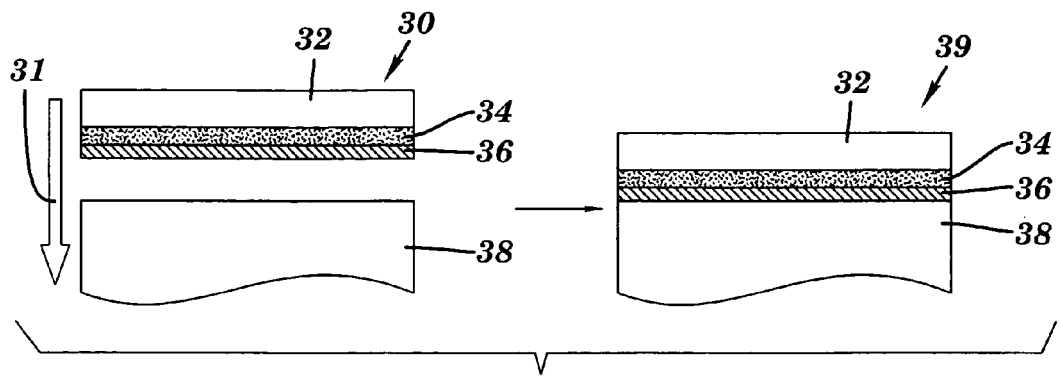
FIGS. 4A, 4B, and 4C are cross-sectional views of laminates in accordance with the present invention and cross sectional views-of other objects produced in accordance with the methods of the present invention.
Figure 4B:
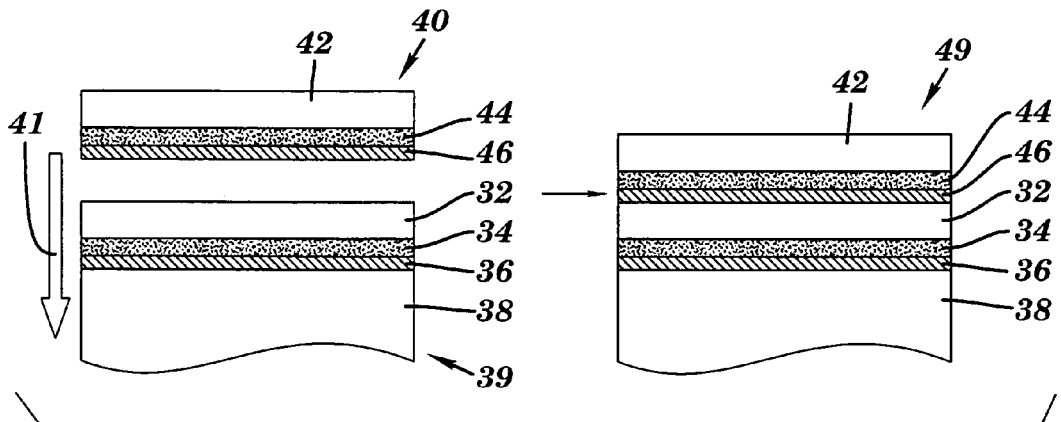
Figure 4C:
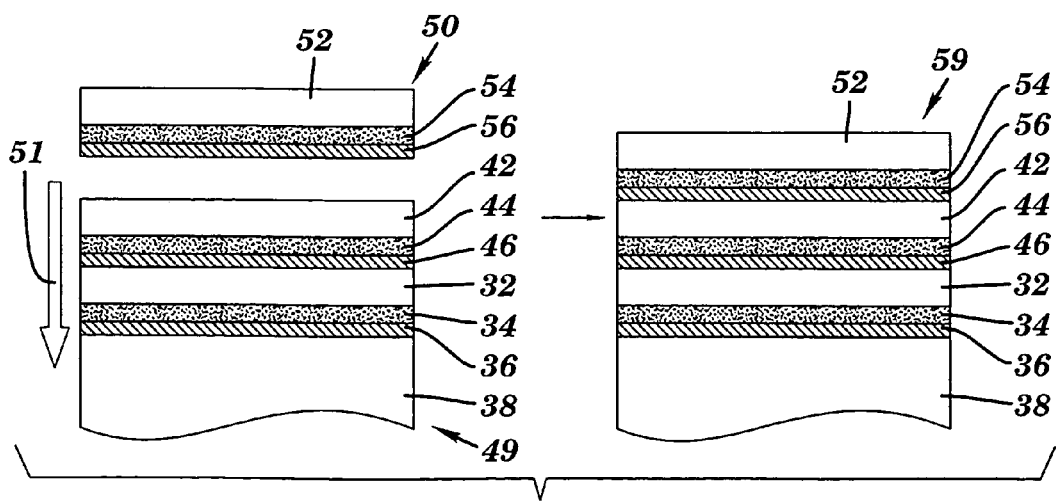

This embodiment of the present invention is illustrated in FIGS. 4A–4C. As shown in FIG. 4A, laminate structure 30, which contains polymeric sheet material 32, metal layer 34, and adhesive layer 36, is provided and is contacted with non-metallic surface 38 such that adhesive layer 36 contacts and bonds to non-metallic surface 38 (e.g., forcing laminate structure 30 against non-metallic surface 38 in a direction represented by arrow 31). In this manner, mono-laminate structure 39 is produced.

The process can be repeated, as is further illustrated in FIG. 42. Here, laminate structure 40, which contains polymeric sheet material 42, metal layer 44, and adhesive layer 46, is provided and is contacted with polymeric sheet material 32 of mono-laminate structure 39 such that adhesive layer 46 contacts and bonds to mono-laminate structure 39's polymeric sheet material 32. This can be achieved, for example, by forcing laminate structure 40 against mono-laminate structure 39's polymeric sheet material 32 in a direction represented by arrow 41). In this manner, bi-laminate structure 49 is produced.

The process can be repeated again, as is further illustrated in FIG. 4C. Here, laminate structure 50, which contains polymeric sheet material 52, metal layer 54, and adhesive layer 56, is provided and is contacted with polymeric sheet material 42 of bi-laminate structure 49 such that adhesive layer 56 contacts and bonds to bi-laminate structure 49's polymeric sheet material 42. This can be achieved, for example, by forcing laminate structure 50 against bi-laminate structure 49's polymeric sheet material 42 in a direction represented by arrow 51). In this manner, tri-laminate structure 59 is produced.

Where more than one laminate structure is employed, e.g., in cases where a bi-laminated or tri-laminate structure is produced, the laminate structures (e.g., laminate structure 30, laminate structure 40, and laminate structure 50) can all be the same (i.e., each of their polymeric sheet materials, each of their metal layers, and each of their adhesive layers can all be the same). Alternatively, one or more of the laminate structures can be different from the others. For example, adhesive layer 32 of the laminate structure closest to non-metallic surface 38 (i.e., of laminate structure 30) can be chosen so as to optimize its ability to adhere to non-metallic surface 38, while the adhesive layers of the other laminate structures can be the same (as each other) and chosen so as to optimize their ability to adhere to the polymeric sheet materials with which they are contacted. Alternatively or additionally, all or some of the polymeric sheet materials (e.g., the polymeric sheet material 52 of the outermost laminate structure 50) can be chosen so as to optimize its properties with respect to color, light absorbance, refraction, and/or reflection; sound absorbance refraction, and/or reflection; anti-static properties, inertness to chemicals (environmental or otherwise); permeability to gases and/or liquids; washability; coefficients of friction; abrasion resistance; UV protection, and the like. For example, various polymeric sheet materials (e.g. polymeric sheet material 52 of laminate structure 50) can include one or more agents selected from the group consisting of fire retarding agents, coloring agents (e.g., dyes and/or pigments), UV-absorbing agents (e.g., titanium dioxide), anti-static agents, lustrants, anti-lustrants, radar-absorbing agents, etc. Methods for incorporating such agents into and onto polymeric sheet materials are known. For example, the methods described in U.S. Pat. No. 5,977,241 to Koloski et al. and in WO 98/37964 to Koloski et al., which are hereby incorporated by reference, can be employed. Other suitable methods for incorporating such agents into and onto polymeric sheet materials are described in applicants' U.S. patent application Ser. No. 09/532,993 and in applicants' U.S. Provisional Patent Application Ser. No. 60/181,505.

Additionally or alternatively, coatings can, optionally, be applied to the outermost polymeric sheet material, for example, by conventional spraying, brushing, and/or dip-coating methods.

Referring to tri-laminate structure 59 in FIG. 4C, the combinations of metal layers and polymeric sheet materials set forth in the following Table 2 are illustrative of the present invention. Note that, in Table 2, each row represents a different combination of metal layers and polymeric sheet materials and that the identity of the various layers in a particular combination is set forth as one moves across a row from left to right.

TABLE 2

| metal layer 34 | polymeric sheet material 32 | metal layer 44 | polymeric sheet material 42 | metal layer 54 | polymeric sheet material 52 |
|---|---|---|---|---|---|
| None | film | None | None | None | None |
| None | film | None | film | None | None |
| None | fabric | None | film | None | None |
| Cu film | film | None | None | None | None |
| Cu film | film | None | film | None | None |
| Cu film | fabric | None | film | None | None |
| Cu pattern | film | None | None | None | None |
| Cu pattern | film | None | film | None | None |
| Cu pattern | fabric | None | film | None | None |
| Al film | film | None | None | None | None |
| Al film | film | None | film | None | None |
| Al film | fabric | None | film | None | None |
| None | film | Cu film | film | None | None |
| None | fabric | Cu film | film | None | None |
| Cu film | film | Cu film | film | None | None |
| Cu film | film | Cu film | film | None | None |
| Cu film | fabric | Cu film | film | None | None |
| Cu pattern | film | Cu film | film | None | None |
| Cu pattern | fabric | Cu film | film | None | None |
| None | film | Cu pattern | film | None | None |
| None | fabric | Cu pattern | film | None | None |
| Cu film | film | Cu pattern | film | None | None |
| Cu film | fabric | Cu pattern | film | None | None |
| Cu pattern | film | Cu pattern | film | None | None |
| Cu pattern | fabric | Cu pattern | film | None | None |
| None | film | Al film | film | None | None |
| None | fabric | Al film | film | None | None |
| Cu film | film | Al film | film | None | None |
| Cu film | fabric | Al film | film | None | None |
| Cu pattern | film | Al film | film | None | None |
| Cu pattern | fabric | Al film | film | None | None |
| None | film | Cu film | film | None | film |
| None | fabric | Cu film | film | None | film |
| Cu film | film | Cu film | film | None | film |
| Cu film | fabric | Cu film | film | None | film |
| Cu pattern | film | Cu film | film | None | film |
| Cu pattern | fabric | Cu film | film | None | film |
| None | film | Cu pattern | film | None | film |
| None | fabric | Cu pattern | film | None | film |
| Cu film | film | Cu pattern | film | None | film |
| Cu film | fabric | Cu pattern | film | None | film |
| Cu pattern | film | Cu pattern | film | None | film |
| Cu pattern | fabric | Cu pattern | film | None | film |
| None | film | Al film | film | None | film |
| None | fabric | Al film | film | None | film |
| Cu film | film | Al film | film | None | film |
| Cu film | fabric | Al film | film | None | film |
| Cu pattern | film | Al film | film | None | film |
| Cu pattern | fabric | Al film | film | None | film |
| None | film | Cu film | fabric | None | film |
| None | fabric | Cu film | fabric | None | film |
| Cu film | film | Cu film | fabric | None | film |
| Cu film | fabric | Cu film | fabric | None | film |
| Cu pattern | film | Cu film | fabric | None | film |
| Cu pattern | fabric | Cu film | fabric | None | film |
| None | film | Cu pattern | fabric | None | film |
| None | fabric | Cu pattern | fabric | None | film |
| Cu film | film | Cu pattern | fabric | None | film |
| Cu film | fabric | Cu pattern | fabric | None | film |
| Cu pattern | film | Cu pattern | fabric | None | film |
| Cu pattern | fabric | Cu pattern | fabric | None | film |
| None | film | Al film | fabric | None | film |
| None | fabric | Al film | fabric | None | film |
| Cu film | film | Al film | fabric | None | film |
| Cu film | fabric | Al film | fabric | None | film |
| Cu pattern | film | Al film | fabric | None | film |
| Cu pattern | fabric | Al film | fabric | None | film |
| None | film | Cu film | film | Cu film | film |
| None | fabric | Cu film | film | Cu film | film |
| Cu film | film | Cu film | film | Cu film | film |
| Cu film | fabric | Cu film | film | Cu film | film |
| Cu pattern | film | Cu film | film | Cu film | film |
| Cu pattern | fabric | Cu film | film | Cu film | film |
| None | film | Cu pattern | film | Cu film | film |
| None | fabric | Cu pattern | film | Cu film | film |
| Cu film | film | Cu pattern | film | Cu film | film |
| Cu film | fabric | Cu pattern | film | Cu film | film |
| Cu pattern | film | Cu pattern | film | Cu film | film |
| Cu pattern | fabric | Cu pattern | film | Cu film | film |
| None | film | Al film | film | Cu film | film |
| None | fabric | Al film | film | Cu film | film |
| Cu film | film | Al film | film | Cu film | film |
| Cu film | fabric | Al film | film | Cu film | film |
| Cu pattern | film | Al film | film | Cu film | film |
| Cu pattern | fabric | Al film | film | Cu film | film |
| None | film | Cu film | fabric | Cu film | film |
| None | fabric | Cu film | fabric | Cu film | film |
| Cu film | film | Cu film | fabric | Cu film | film |
| Cu film | fabric | Cu film | fabric | Cu film | film |
| Cu pattern | film | Cu film | fabric | Cu film | film |

TABLE 2-continued

| metal layer 34 | polymeric sheet material 32 | metal layer 44 | polymeric sheet material 42 | metal layer 54 | polymeric sheet material 52 |
|---|---|---|---|---|---|
| Cu pattern | fabric | Cu film | fabric | Cu film | film |
| None | film | Cu pattern | fabric | Cu film | film |
| None | fabric | Cu pattern | fabric | Cu film | film |
| Cu film | film | Cu pattern | fabric | Cu film | film |
| Cu film | fabric | Cu pattern | fabric | Cu film | film |
| Cu pattern | film | Cu pattern | fabric | Cu film | film |
| Cu pattern | fabric | Cu pattern | fabric | Cu film | film |
| None | film | Al film | fabric | Cu film | film |
| None | fabric | Al film | fabric | Cu film | film |
| Cu film | film | Al film | fabric | Cu film | film |
| Cu film | fabric | Al film | fabric | Cu film | film |
| Cu pattern | film | Al film | fabric | Cu film | film |
| Cu pattern | fabric | Al film | fabric | Cu film | film |
| None | film | Cu film | film | Cu pattern | film |
| None | fabric | Cu film | film | Cu pattern | film |
| Cu film | film | Cu film | film | Cu pattern | film |
| Cu film | fabric | Cu film | film | Cu pattern | film |
| Cu pattern | film | Cu film | film | Cu pattern | film |
| Cu pattern | fabric | Cu film | film | Cu pattern | film |
| None | film | Cu pattern | film | Cu pattern | film |
| None | fabric | Cu pattern | film | Cu pattern | film |
| Cu film | film | Cu pattern | film | Cu pattern | film |
| Cu film | fabric | Cu pattern | film | Cu pattern | film |
| Cu pattern | film | Cu pattern | film | Cu pattern | film |
| Cu pattern | fabric | Cu pattern | film | Cu pattern | film |
| None | film | Al film | film | Cu pattern | film |
| None | fabric | Al film | film | Cu pattern | film |
| Cu film | film | Al film | film | Cu pattern | film |
| Cu film | fabric | Al film | film | Cu pattern | film |
| Cu pattern | film | Al film | film | Cu pattern | film |
| Cu pattern | fabric | Al film | film | Cu pattern | film |
| None | film | Cu film | fabric | Cu pattern | film |
| None | fabric | Cu film | fabric | Cu pattern | film |
| Cu film | film | Cu film | fabric | Cu pattern | film |
| Cu film | fabric | Cu film | fabric | Cu pattern | film |
| Cu pattern | film | Cu film | fabric | Cu pattern | film |
| Cu pattern | fabric | Cu film | fabric | Cu pattern | film |
| None | film | Cu pattern | fabric | Cu pattern | film |
| None | fabric | Cu pattern | fabric | Cu pattern | film |
| Cu film | film | Cu pattern | fabric | Cu pattern | film |
| Cu film | fabric | Cu pattern | fabric | Cu pattern | film |
| Cu pattern | film | Cu pattern | fabric | Cu pattern | film |
| Cu pattern | fabric | Cu pattern | fabric | Cu pattern | film |
| None | film | Al film | fabric | Cu pattern | film |
| None | fabric | Al film | fabric | Cu pattern | film |
| Cu film | film | Al film | fabric | Cu pattern | film |
| Cu film | fabric | Al film | fabric | Cu pattern | film |
| Cu pattern | film | Al film | fabric | Cu pattern | film |
| Cu pattern | fabric | Al film | fabric | Cu pattern | film |
| None | film | Cu film | film | Al film | film |
| None | fabric | Cu film | film | Al film | film |
| Cu film | film | Cu film | film | Al film | film |
| Cu film | fabric | Cu film | film | Al film | film |
| Cu pattern | film | Cu film | film | Al film | film |
| Cu pattern | fabric | Cu film | film | Al film | film |
| None | film | Cu pattern | film | Al film | film |
| None | fabric | Cu pattern | film | Al film | film |
| Cu film | film | Cu pattern | film | Al film | film |
| Cu film | fabric | Cu pattern | film | Al film | film |
| Cu pattern | film | Cu pattern | film | Al film | film |
| Cu pattern | fabric | Cu pattern | film | Al film | film |
| None | film | Al film | film | Al film | film |
| None | fabric | Al film | film | Al film | film |
| Cu film | film | Al film | film | Al film | film |
| Cu film | fabric | Al film | film | Al film | film |
| Cu pattern | film | Al film | film | Al film | film |
| Cu pattern | fabric | Al film | film | Al film | film |
| None | film | Cu film | fabric | Al film | film |
| None | fabric | Cu film | fabric | Al film | film |
| Cu film | film | Cu film | fabric | Al film | film |
| Cu film | fabric | Cu film | fabric | Al film | film |
| Cu pattern | film | Cu film | fabric | Al film | film |
| Cu pattern | fabric | Cu film | fabric | Al film | film |
| None | film | Cu pattern | fabric | Al film | film |
| Cu film | film | Cu pattern | fabric | Al film | film |
| Cu film | fabric | Cu pattern | fabric | Al film | film |
| Cu pattern | film | Cu pattern | fabric | Al film | film |
| Cu pattern | fabric | Cu pattern | fabric | Al film | film |
| None | film | Al film | fabric | Al film | film |
| None | fabric | Al film | fabric | Al film | film |
| Cu film | film | Al film | fabric | Al film | film |
| Cu film | fabric | Al film | fabric | Al film | film |
| Cu pattern | film | Al film | fabric | Al film | film |
| Cu pattern | fabric | Al film | fabric | Al film | film |

"Cu pattern", as used in Table 2, is a patterned metal layer in which the metal is copper, for example, as in where the "Cu pattern" is a copper mesh layer or a copper expanded metal foil. Each of the polymeric sheet material films and fabrics referred to in Table 2 can independently be made of, for example, halopolymers (e.g., fluoropolymers). For example, the uppermost polymeric sheet material layer (e.g., 52) can be a fluoropolymer film while each of the other polymeric sheet material layers (e.g., 32 and 42) can be non-fluoropolymer films or fabrics (e.g., an olefinic film or fabric). In the illustrative embodiments set forth in Table 2, each layer can be adhered to one or both of its adjacent layers. Where the layer being adhered is a halopolymer (e.g., a fluoropolymer), it can be treated as described above, for example, to improve adhesion of the adhesive thereto. Metal layers can be adhered to adjacent polymeric sheet materials using adhesives, or they can be bonded to one of their adjacent polymeric sheet materials, for example, by employing the metallization procedures described above.

Although the embodiments of the present invention illustrated in FIGS. 1A, 1B, 2A, 2B, 2C, 2D, 3A, 3B, 3C, 3D, 4A, 4B, and 4C show the various metal layers, polymeric sheet materials, and adhesives as having substantially the same thickness, such need not be the case. Suitable thicknesses for polymeric sheet materials range from about 0.0001 mil to about 40 mil, such as from about 0.0005 mil to about 25 mil, from about 0.001 mil to about 20 mil, from about 0.001 mil to about 10 mil, from about 0.00 mil to about 10 mil, from about 0.05 mil to about 2 mil, and/or from about 0.1 mil to about 1 mil. Suitable thicknesses for metal layers range from about 0.0001 mil to about 25 mil, such as from about 0.0005 mil to about 20 mil, from about 0.001 mil to about 15 mil, from about 0.002 mil to about 10 mil, from about 0.005 mil to about 10 mil, from about 0.01 mil to about 10 mil, from about 0.1 mil to about 10 mil, from about 0.2 mil to about 10 mil, from about 0.5 to about 10 mil, from about 1 mil to about 10 mil, from about 2 mil to about 8 mil, and/or about 5 mil. Suitable thicknesses for adhesives range from about 0.1 mil to about 20 mil, such as from about 0.5 mil to about 10 mil, from about 1 mil to about 5 mil, from about 2 mil to about 4, and/or about 3 mil.

Figure 5A:
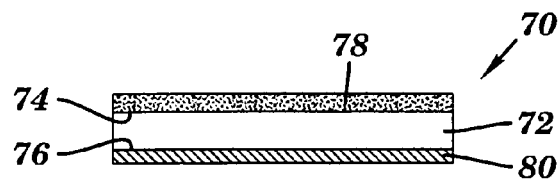
FIGS. 5A, 5B, and 5C are cross-sectional views of other laminates in accordance with the present invention and cross sectional views of other objects produced in accordance with the methods of the present invention.

Furthermore, although the embodiments of the present invention illustrated 4A, 4B, and 4C show the use of laminate structures (e.g., laminate structure 30) in which one surface of a metal layer (e.g., metal layer 34) is bonded or adhered to the polymeric sheet material (e.g., polymeric sheet material 32) and in which an adhesive layer (e.g., adhesive layer 36) is disposed on the other surface of the metal layer (e.g., metal layer 34), other laminate structures can be used in the practice of the present invention. For example, the method of the present invention can be practiced using laminate structures in which the metal layer is bonded or adhered to one surface of a halopolymer fabric and in which an adhesive layer is disposed on the other surface of the halopolymer fabric. Such a laminate structure, to which the present invention also relates, is illustrated in FIG. 5A. There, laminate structure 70 includes halopolymer fabric 72 which has first surface 74 and second surface 76. Metal-layer 78 is bonded to first surface 74 of halopolymer fabric 72, or metal layer 78 is adhered to first surface 74 of halopolymer fabric 72. Adhesive layer 80 is disposed on second surface 76 of halopolymer fabric 72. In the case where metal layer 78 is bonded to first surface 74 of halopolymer fabric 72, bonding of metal layer 78 to first surface 74 of halopolymer fabric 72 can be effected, for example, by using the methods described-above for bonding metal layers to halopolymers (e.g., those described in Vargo I, Koloski, and/or Vargo II, which are hereby incorporated by reference). In the case where metal layer 78 is adhered to first surface 74 of halopolymer fabric 72, adhering of metal layer 78 to first surface 74 of halopolymer fabric 72 can be effected, for example, by using an adhesive (not shown). Preferably, prior to disposing adhesive layer 80 on second surface 76 of halopolymer fabric 72, second surface 76 of halopolymer fabric 72 is treated using the RFGD process or one of the other processes described above to improve adhesion of adhesive layers to halopolymers. Suitable adhesives that can be used to form adhesive layer 80 include those described above. Methods for bonding metal layers and adhesive layers to non-fabric halopolymers are described in applicants, U.S. patent application Ser. No. 09/239,108, which is hereby incorporated by reference. Such methods have been found to be suitable for making the laminate structures of the present invention in which the metal layer is bonded or adhered to one surface of a halopolymer fabric and in which an adhesive layer is disposed on the other surface of the halopolymer fabric.

Figure 5B:
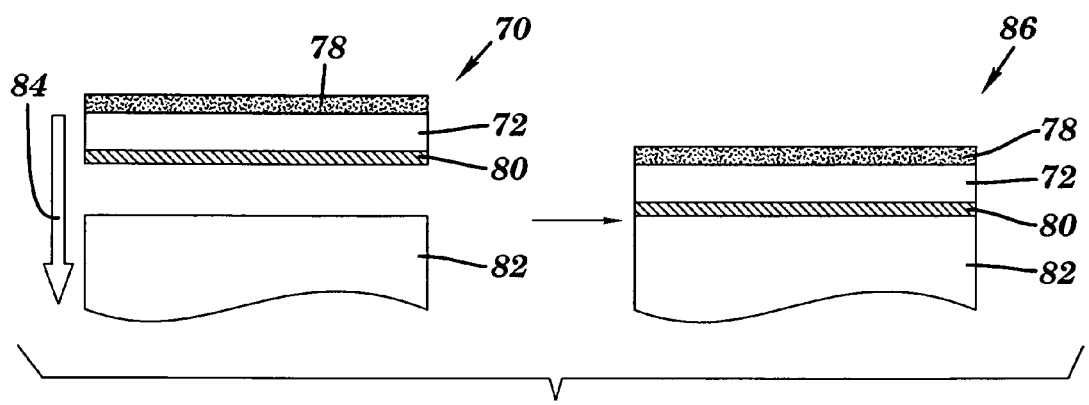
Figure 5C:
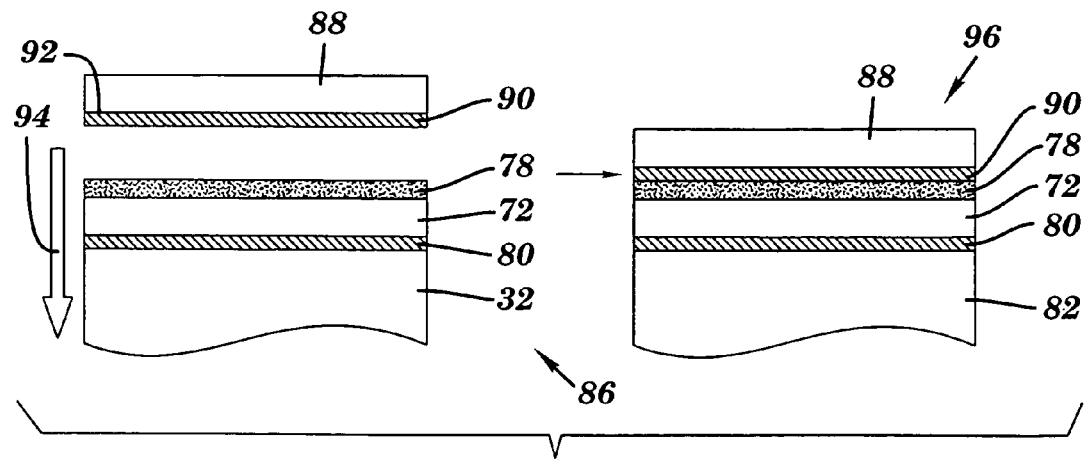

Once laminate structure 70 is formed, it can be used in the method of the present invention, for example, as illustrated in FIG. 5B, by forcing adhesive layer 80 of laminate structure 70 into contact with non-metallic surface 82 (in a direction represented by arrow 84) to produce laminate structure 86. Optionally, a second laminate structure 70 can be added to laminate structure 86 by bringing the adhesive layer of the second laminate structure 70 into contact with metal layer 78 of laminate structure 86. Third, fourth, etc. laminate structures 70 can be optionally added in this manner. Also optionally, it can be advantageous to apply a polymeric sheet material over the outermost metal layer, for example as illustrated in FIG. 5C. In FIG. 5C, polymeric sheet material 88 has an adhesive layer 90 disposed on surface 92 thereof, and adhesive layer 90 brought into contact with metal layer 78 of laminate structure 86 (in a direction represented by arrow 94) to produce laminate structure 96. In the case where polymeric sheet material 88 is a halopolymer sheet material (e.g., a fluoropolymer sheet material), it can be desirable to treat surface 92 of halopolymer sheet material 88 so as to improve adhesion of adhesive layer 90 thereto. The RFGD methods and/or other methods described above for treating halopolymer surfaces to improve adhesion of adhesives thereto are suitable for promoting adhesion of adhesive layer 90 to halopolymer sheet material 88.

The present invention also relates to objects which include a substrate having a non-metallic surface, a halopolymer sheet material disposed over the substrate's non-metallic surface, and a metal layer disposed between the halopolymer sheet material and the substrate's non-metallic surface. The object can further include other polymeric sheet material layers, other metal layers, or both, as described above. For example, objects having the layered configurations illustrated in FIGS. 1A, 1B, 2A, 2B, 2C, 2D, 3A, 3B, 3C, 3D, 4A, 4B, 4C, 5B, and 5C and/or having the layered configurations set forth in Table 2, above, are contemplated as illustrative of objects of the present invention. The entire surface of the object's substrate can be covered with the laminate structure (i.e., with the halopolymer sheet material, metal layer, and optional additional polymeric sheet material(s) and/or metal layer(s)), or, alternatively, only a portion of the surface can be so covered. Examples of substrates suitable for use in the present invention include vehicles, such as aircraft vehicles (e.g., airplanes, helicopters, rockets, missiles, reusable space vehicles, etc.), water-going vehicles (e.g., boats, ships, hovercraft, and marine vessels), and land vehicles (e.g., cars, trucks, trailers, railroad cars and engines, subway cars and engines, etc.). Parts of such vehicles, such as airplane fuselages, airplane turbine housings, airplane engine housings, airplane propellers, airplane rudders, airplane wings, airplane wheel mounts and wheels, airplane stabilizers, and the like, are also meant to be included within the meaning of "substrate" as used herein.

Application of the a halopolymer sheet material and metal layer over the substrate's non-metallic surface can be carried out using any of the methods described above, for example, by using adhesives, by using adhesive layers, and/or by bonding the metal layer to the halopolymer sheet material (e.g., using the metallization process described above) prior to applying them to the substrate's non-metallic surface, etc. As one skilled in the art will recognize, applying sheet materials to surfaces can be facilitated by, for example, applying the sheet material in sections, removing some of the sheet material (e.g., "taking darts"), stretching (such as described in U.S. Pat. No. 4,986,496 to Marentic et al., which is hereby incorporated by reference), and/or shaping the sheet material using molds (such as described in U.S. Pat. No. 5,660,667 to Davis, which is hereby incorporated by reference).

The present invention is further illustrated with the following examples.

EXAMPLES

Example 1

Lightning Strike Tests: Materials and Methods

This example sets forth the codes that are used in Examples 2–6.

"PVDF" is polyvinylidene fluoride (also known as HYLAR™). "5PVDFCU" is 5 mil PVDF with 4 mil acrylic (Adchem 747) adhesive, Astroseal Cu expanded copper foil (Part No. CU 029 CXM C26), and 4 mil acrylic adhesive (Adchem 747). "2PVDFCU" is 2 mil PVDF with 4 mil acrylic (Adchem 747) adhesive, Astroseal Cu expanded copper foil (Part No. CU 029 CXM C26), and 4 mil acrylic adhesive (Adchem 747).

"MFA" is perfluoroalkoxy fluoropolymer known as HYFLON™. "5MFACU" is 5 mil MFA with 4 mil acrylic (Adchem 747) adhesive, Astroseal Cu expanded copper foil (Part No. CU 029 CXM C26), and 4 mil acrylic adhesive (Adchem 747). "2MFACU" is 2 mil MFA with 4 mil acrylic (Adchem 747) adhesive, Astroseal Cu expanded copper foil (Part No. CU 029 CXM C26), and 4 mil acrylic adhesive (Adchem 747). "5MFA" is 5 mil MFA with 4 mil acrylic (Adchem 747) adhesive. "2MFA" is 2 mil MFA with 4 mil acrylic (Adchem 747) adhesive. "MFA Fabric" is 5 mil MFA fabric with 4 mil acrylic (Adchem 747) adhesive.

"PVF" is Polyvinyl Fluoride (also known as TED-LAR™). "2PVF" is 2 mil PVF with 4 mil acrylic (Adchem 747) adhesive. "2PVFCU" is 2 mil PVF with 4 mil acrylic (Adchem 747) adhesive, Astroseal Cu expanded copper foil (Part No. CU 029 CXM C26), and 4 mil acrylic adhesive (Adchem 747).

Example 2

Lightning Strike Tests: Test Panels

Nine carbon composite test panels were laminated with polymer film appliques using a different permutation for each panel. More particularly, Test Panels 1–9 were constructed as follows:
1. 5PVDFCU
2. 2PVDFCU
3. 5PVDF over Cu metallized MFA fabric
4. 2PVDF over Cu metallized MFA fabric
5. 5PVDFCU over Cu metallized MFA fabric
6. 2PVFCU
7. 2MFACU
8. 5MFACU
9. 5MFACU over Cu metallized MFA fabric In each of test Panels 3–5 and 9, the fabric material was laminated under the 5PVDF, 2PVDF, 5PVDFCU, or 5MFACU such that the fabric was directly laminated onto the carbon composite with the 5PVDF, 2PVDF, 5PVDFCU, or 5MFACU laminated over the MFA metallized fabric.

Example 3

Lightning Strike Tests: Test Procedures

Test panels were tested at Lightning Technologies, Inc. in Pittsfield, Mass. The tests were designed to demonstrate various levels of lightning strike protection capabilities of each tested applique. Each lightning strike applique material showed different levels of lightning strike protection as described below in Tables 3 and 4. Additionally, Tables 3 and 4 list various levels of utility for actual lightning strike protection including a $10^6$ volt dielectric breakdown high voltage test and a Zone 2A high current test including components B, C, and D. All calibrations were performed in accordance with MIL-STD-45662A For the high voltage tests, each panel to be tested was positioned horizontally on supports directly beneath a 10 cm diameter spherical electrode connected to the output of a high voltage generator. The air gap between the electrode and the panel surface was set at 0.5 m or 1 m,. All conductive elements were grounded. A Polaroid and 35 mm camera was positioned around the test setup in order to record each strike. The 15 stage Marx generator was configured for voltage Waveform A, which has an average rate of rise (dv/dt) of 1,000 kV/µs (±50%) until interrupted by an air gap flashover. It was generated by a 1.5 MV Marx-type generator, measured by a resistive voltage divider, and recorded by an oscilloscope. The peak voltage amplitude ($V_{pk}$) and rate-of-rise were derived from the waveform oscillogram.

For the high current tests, each panel to be tested was positioned horizontally on supports at the high current generator. Aluminum bars were clamped to two opposite sides of the panel to provide current return paths to the generator ground bus. A jet-diverting electrode was positioned one inch from the panel surface at the test location. An AWG #32 initiator wire, connected to the electrode, was set 0.25 inches from the panel surface. The generator was set for Zone 2A which applied current components D, B, and C*, where C* represents a portion of Component C based on the expected dwell time of the lightning channel. The dwell time was 15 ms for these tests, resulting in a charge transfer of 6 coulombs. Current component D had a peak amplitude ("$I_{pk}$") of 100 kA (±10%) and an action integral ("AI") of $0.25 \times 10^6$ A$^2$·s (±20%). It was generated by a capacitor bank with the bank capacitance, charge level, and series impedance adjusted to meet test requirements. Current Component B had an average amplitude of 2 kA (±10%) and delivered a maximum charge of 10 coulombs. It was generated by a capacitor bank that discharged into the test panel once the arc was established by the Component D generator. Current Component C* had an amplitude of 200–800 A and delivered a charge of 6 coulombs. It was generated by the partial discharge of a dc battery bank. The discharge was terminated by a cutout fuse once the required charge had been transferred to the test panel. A wide band impulse current transformer measured Component D parameters. Components B and C* were measured by precision shunt resistors. All waveforms were recorded by oscilloscopes, and the resulting oscillograms were used to derive peak current amplitudes, action integrals, and charge transfers.

Example 4

Lightning Strike Tests: High Voltage Test Results

The majority of tests were performed with the electrode air gap set at 0.5 meters. In some cases a surface flashover occurred to the panel edge where attachment was made to the copper foil. After the setup was modified (i.e., after the electrode air gap was changed), the repeat test resulted in puncture of applique to the carbon fiber panel. Punctures occurred on all panels, either during the initial strike or during a repeat strike. Table 3 describes the visual effect results. From visual inspection we found no damage to the underlying carbon composite test panel.

TABLE 3

| Test No. | Test Panel | $V_{pk}$ (kV) | Polarity | Air Gap (meters) | Results |
|---|---|---|---|---|---|
| 1 | 1 | 1320 | negative | 1.0 | Flashover to edge of exposed copper foil |
| 2 | 1 | 900 | negative | 0.5 | Puncture to CFC (carbon fiber composite) |
| 3 | 2 | 1300 | negative | 1.0 | Puncture to CFC |
| 4 | 2 | 900 | negative | 0.5 | New Puncture hole to CFC (previous hole covered with tape) |
| 5 | 2 | 900 | negative | 0.5 | New puncture hole to CFC (previous holes covered with tape) |
| 6 | 3 | 900 | negative | 0.5 | Puncture to CFC |
| 7 | 4 | 840 | negative | 0.5 | Puncture to CFC |
| 8 | 5 | 900 | negative | 0.5 | Surface flashover - puncture on edge of panel |
| 9 | 5 | 900 | negative | 0.5 | Surface flashover on repeat of test #8 |
| 10 | 9 | 900 | negative | 0.5 | Flashover to edge of exposed copper foil |

TABLE 3-continued

| Test No. | Test Panel | $V_{pk}$ (kV) | Polarity | Air Gap (meters) | Results |
|---|---|---|---|---|---|
| 11 | 9 | 900 | negative | 0.5 | Repeat panel #9 with copper foil folded under panel. Puncture to CFC |
| 12 | 6 | 900 | negative | 0.5 | Puncture to CFC |
| 13 | 7 | 900 | negative | 0.5 | Puncture to CFC |
| 14 | 8 | 900 | negative | 0.5 | Puncture to CFC |
| 15 | 5 | 900 | negative | 0.5 | Surface flashover |
| 24 | 5 | 900 | negative | 0.5 | Puncture to CFC |

Example 5

Lightning Strike Tests: High Current Test Results

A single high current strike was applied to each panel at the location of the high voltage puncture. Four of the nine panels were damaged all the way through the carbon fiber composite ("CFC") test panel. The remaining panels had minor damage. The results are presented in Table 4.

TABLE 4

| | | Component A | | Component B | | Component C | | |
|---|---|---|---|---|---|---|---|---|
| Test No. | Test Panel | $I_{pk}$ (kA) | AI $\times 10^6$ ($A^2 \cdot s$) | $I_{pk}$ (kA) | Charge (C) | $I_{av}$ (A) | Charge (C) | Results |
| 16 | 9 | 105 | 0.26 | 3.2 | 10 | 300 | 13.5 | Puncture thru CFC |
| 17 | 4 | 105 | 0.27 | 3.2 | 10 | 290 | 12.7 | Puncture thru CFC |
| 18 | 3 | 105 | 0.25 | 3.2 | 10 | 310 | 13.6 | Puncture thru CFC |
| 19 | 1 | 99 | 0.25 | 3.2 | 10 | 340 | 12.2 | Negligible damage to CFC surface |
| 20 | 2 | 99 | 0.25 | 3.2 | 9 | 210 | 2.5 | Slight damage to CFC surface |
| 21 | 6 | 100 | 0.28 | 3.2 | 10 | 240 | 2.6 | Slight damage to CFC surface |
| 22 | 8 | 99 | 0.26 | 3.2 | 10 | 315 | 11.3 | Slight damage to CFC surface |
| 23 | 7 | 97 | 0.26 | 3.2 | 10 | 215 | 2.7 | Negligible damage to CFC surface |
| 25 | 5 | 105 | 0.26 | 3.2 | 10 | 275 | 13.9 | Puncture thru CFC |

Example 6

Lightning Strike Tests: Discussion

The results set forth in Tables 3 and 4 show that the fluoropolymer appliques which were metallized with a thin continuous Al or Cu film (ca. 0.25–0.50 microns) or which were laminated with a metallized fluoropolymer fabric were limited damage to the underlying carbon composite panels with respect to a high voltage breakdown. However, these materials were not very efficient at limiting lightning strike damage to the underlying carbon composite panels when subjected to High Current testing.

In contrast, thin fluoropolymer films constructed using a copper metallic expanded foil provided good results. The best test panel exhibited only negligible visual damage to the underlying carbon composite panel, and the worst test panel showed only slight visual damage to the underlying carbon composite panel (in the form of very minor carbon fiber surface bloom).

We also observed that the best panels with respect to limited shear of the applique was found on the thinnest fluoropolymer films, i.e., on the 2 mil PVDF, 2 mil PVF, and 2 mil MFA films. In certain applications, this property may be important, especially in those situations where it is desirable to prevent large film appendages from shearing from the surface during the actual flight of the aircraft. It is believed that to the extent that lightning strike protection is facilitated by sacrificial loss (e.g., vaporization) of the applique film, limiting the applique's shear leaves behind a semi-smooth area that will not be subsequently torn further, for example, by the shearing effects of wind. The results observed for the 2 mil films demonstrated this property and were easily repaired.

Although the invention has been described in detail for the purpose of illustration, it is understood that such detail is solely for that purpose, and variations can be made therein by those skilled in the art without departing from the spirit and scope of the invention which is defined by the following claims.

What is claimed:

1. A method of reducing damage resulting from a lightning strike on a non-metallic surface, wherein the non-metallic surface is an external surface of a windmill, said method comprising:
    disposing a polymeric sheet material over the non-metallic surface; and
    disposing a metal layer between the non-metallic surface and the polymeric sheet material by adhering the metal layer directly to the non-metallic surface, wherein the polymeric sheet material and the metal layer form a layered structure in which the polymeric sheet material is the layered structure's outermost layer.

2. A method according to claim 1, wherein the polymeric sheet material comprises a polymer selected from the group consisting of polyolefins, polyimides, polyesters, polyacrylates, halopolymers, and combinations thereof.

3. A method according to claim 1, wherein the polymeric sheet material is a polymeric fabric.

4. A method according to claim 1, wherein the polymeric sheet material is a halopolymer fabric.

5. A method according to claim 1, wherein the polymeric sheet material is a fluoropolymer fabric.

6. A method according to claim 1, wherein the metal layer is a metal mesh or an expanded metal foil.

7. A method according to claim 1, wherein the metal layer is bonded to the polymeric sheet material and wherein said disposing a polymeric sheet material and said disposing a metal layer are carried out in a single step.

8. A method according to claim 7, wherein the polymeric sheet material is a halopolymer sheet material and wherein the metal layer is bonded to the polymeric sheet material by a method comprising:

substituting at least a portion of halogen atoms on the outermost surface of the halopolymer sheet material with hydrogen and oxygen or oxygen-containing groups to thus provide an oxyhalopolymer sheet material; and contacting the oxyhalopolymer sheet material with a solution or gas comprising a metal for a period of time sufficient to facilitate bonding of the metal to the oxyhalopolymer sheet material.

9. A method according to claim 7, wherein the polymeric sheet material's surface comprises functional groups which will bind an electroless metallization catalyst and wherein the metal layer is bonded to the polymeric sheet material by a method comprising:

contacting the polymeric sheet materiaLs surface's functional groups with an electroless metallization catalyst to obtain a catalytic surface; and contacting the catalytic surface with an electroless metallization solution under conditions effective to metallize the polymeric sheet material's surface.

10. A method according to claim 7, wherein the metal layer is adhered directly to the non-metallic surface with an adhesive.

11. A method according to claim 1, wherein the polymeric sheet material is a first polymeric sheet material and wherein said method further comprises:

disposing a second polymeric sheet material between the first polymeric sheet material and the metal layer.

12. A method according to claim 11, wherein said method further comprises;

disposing a second metal layer between the first polymeric sheet material and the second polymeric sheet material.

13. A method according to claim 12, wherein said method further comprises:

disposing a third polymeric sheet material between the first polymeric sheet material and the second metal layer; and disposing a third metal layer between the second polymeric sheet material and the third polymeric sheet material.

14. A method accordinq to claim 1, wherein the metal layer is adhered to the polymeric sheet material and wherein said disposing a polymeric sheet material and said disposing a metal layer are carried out in a single step.

15. A method of reducing damage resultion from a lightning strike on a non-metallic surface, wherein the non-metallic surface isan external surface of a windmill, said method comprising:

providing a laminate comprising a polymeric sheet material bonded or adhered to a metal layer; and disposing the laminate over the non-metallic surface such that the metal layer is disposed between the polymeric sheet material and the non-metallic surface.

16. A method according to claim 15, wherein said disposing comprises:

adhering the laminate's metal layer directly to the non-metallic surface.

17. A method according to claim 15, wherein the laminate comprises a polymeric sheet material that is adhered to a metal layer.

18. A method according to claim 15, wherein the laminate comprises a polymeric sheet material that is bonded to a metal layer.

19. A method of reducing damage resulting from a lightning strike on a non-metallic surface, wherein the non-metallic surface is an external surface of a windmill, said method comprising:

disposing a polymeric sheet material over the non-metallic surface; and disposing a metal layer between the non-metallic surface and the polymeric sheet material, wherein the polymeric sheet material and the metal layer form a layered structure in which the polymeric sheet material is the layered structure's outermost layer.

20. A method according to claim 19, wherein, the polyweric sheet material comprises a polymer selected from the group consisting of polyolefins, polyimides, polyesters, polyacrylates, halopolymers, and combinations thereof.

21. A method according to claim 19, wherein the polymeric sheet material is a polymeric fabric.

22. A method according to claim 19, wherein the polymeric sheet material is a halopolymer fabric.

23. A method according to claim 19, wherein the polymeric sheet material is a fluoropolymer fabric.

24. A method according to claim 19, wherein the metal layer is a metal mesh or an expanded metal foil.

25. A method according to claim 19, wherein the metal layer is bonded to the polymeric sheet material and wherein said disposing a polymeric sheet material and said disposing a metal layer are carried out in a single step.

26. A method according to claim 25, wherein the polymeric sheet material is a halopolymer sheet material and wherein the metal layer is bonded to the polymeric sheet material by a method comprising:

substituting at least a portion of halogen atoms on the outermost surface of the halopolymer sheet material with hydrogen and oxygen or oxygen-containing groups to thus provide an oxyhalopolymer sheet material; and contacting the oxyhalopolymer sheet material with a solution or gas comprising a metal for a period of time sufficient to facilitate bonding of the metal to the oxyhalopolymer sheet material.

27. A method according to claim 25, wherein the polymeric sheet material's surface comprises functional groups which will bind an electroless metallization catalyst and wherein the metal layer is bonded to the polymeric sheet material by a method comprising:

contacting the polymeric sheet material's surface's functional groups with an electroless metallization catalyst to obtain a catalytic surface; and contacting the catalytic surface with an electroless metallization solution under conditions effective to metaJlize the polymeric sheet material's surface.

28. A method according to claim 25, wherein the metal layer is adhered directly to the non-metallic surface with an adhesive.

29. A method according to claim 19, wherein the polymeric sheet material is a first polymeric sheet material and wherein said method further comprises:

disposing a second polymeric sheet material between the first polymeric sheet material and the metal layer.

30. A method according to claim 29, wherein said method further comprises:

disposing a second metal layer between the first polymeric sheet material and the second polymeric sheet material.

31. A method according to claim 30, wherein said. method further comprises:

disposing a third polymeric sheet material between the first polymeric sheet material and the second metal layer; and disposing a third metal layer between the second polymeric sheet material and the third polymeric sheet material.

32. A method according to claim 19, wherein the metal layer is bonded to the polymeric sheet material and wherein said disposing a polymeric sheet material and said disposing a metal layer are carried out in a single step.

* * * * *